United States Patent
Kim et al.

(10) Patent No.: US 9,153,692 B2
(45) Date of Patent: Oct. 6, 2015

(54) SEMICONDUCTOR DEVICE HAVING A STRESS FILM ON A SIDE SURFACE OF A FIN

(71) Applicant: Samsung Electronics Co., Ltd., Suwon-si (KR)

(72) Inventors: Seok-Hoon Kim, Hwaseong-si (KR); Tae-Ouk Kwon, Hwaseong-si (KR); Su-Jin Jung, Hwaseong-si (KR); Young-Pil Kim, Hwaseong-si (KR); Byeong-Chan Lee, Yongin-si (KR); Bon-Young Koo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/194,837

(22) Filed: Mar. 3, 2014

(65) Prior Publication Data
US 2014/0299934 A1    Oct. 9, 2014

(30) Foreign Application Priority Data
Apr. 9, 2013    (KR) .................. 10-2013-0038755

(51) Int. Cl.
*H01L 29/78*    (2006.01)
*H01L 29/66*    (2006.01)

(52) U.S. Cl.
CPC ...... *H01L 29/7848* (2013.01); *H01L 29/66545* (2013.01); *H01L 29/785* (2013.01)

(58) Field of Classification Search
CPC .............. H01L 29/7855; H01L 29/785; H01L 29/7851; H01L 29/7853; H01L 29/7854; H01L 2029/7858
USPC .......................................................... 257/288
See application file for complete search history.

(56) References Cited

U.S. PATENT DOCUMENTS

| | | | |
|---|---|---|---|
| 6,921,982 B2 | 7/2005 | Joshi et al. | |
| 7,348,284 B2 | 3/2008 | Doyle et al. | |
| 7,425,500 B2 | 9/2008 | Metz et al. | |
| 7,622,773 B2 | 11/2009 | Irisawa et al. | |
| 7,671,420 B2 | 3/2010 | Shin et al. | |
| 7,727,830 B2 | 6/2010 | Jin et al. | |
| 7,767,560 B2 | 8/2010 | Jin et al. | |
| 8,048,723 B2 | 11/2011 | Chang et al. | |
| 2010/0207209 A1* | 8/2010 | Inokuma | 257/347 |
| 2011/0147828 A1* | 6/2011 | Murthy et al. | 257/327 |
| 2011/0193178 A1 | 8/2011 | Chang et al. | |
| 2011/0298058 A1 | 12/2011 | Kawasaki et al. | |
| 2012/0319211 A1* | 12/2012 | van Dal et al. | 257/401 |
| 2013/0069128 A1* | 3/2013 | Okano | 257/288 |

* cited by examiner

*Primary Examiner* — Kevin Parendo
(74) *Attorney, Agent, or Firm* — Myers Bigel Sibley & Sajovec, P.A.

(57) ABSTRACT

Provided is a semiconductor device. The semiconductor device includes a fin on a substrate; a gate electrode cross the fin on the substrate; a source/drain formed on at least one of both sides of the gate electrode, and including a first film and a second film; and a stress film arranged between an isolation film on the substrate and the source/drain, and formed on a side surface of the fin.

17 Claims, 27 Drawing Sheets

SEMICONDUCTOR DEVICE HAVING A STRESS FILM ON A SIDE SURFACE OF A FIN

CROSS-REFERENCE TO RELATED APPLICATION

This application is based on and claims priority under 35 U.S.C. §119 from Korean Patent Application No. 10-2013-0038755, filed on Apr. 9, 2013 in the Korean Intellectual Property Office, the disclosure of which is incorporated herein in its entirety by reference.

BACKGROUND

The present invention relates to a semiconductor device and a method for fabricating the same.

One scaling technique that has been proposed to increase the density of integrated circuit devices is to use multi-gate transistors. In these multi-gate transistors, a fin-shaped or nanowire-shaped silicon body (which are collectively referred to herein as "fins") is formed on a substrate and a gate is formed on a surface of the silicon body.

Since multi-gate transistors have a three-dimensional (3D) channel, the use of multi-gate transistors can provide integrated circuit devices having increased integration densities. Further, current control capability can be improved even without increasing a gate length of the multi-gate transistor. In addition, a short channel effect (SCE) in which an electric potential of a channel region is affected by a drain voltage can be reduced or suppressed.

SUMMARY

Embodiments of the present invention provide semiconductor devices which can reduce interference between adjacent transistors and/or which can apply strain to a channel region.

Embodiments of the present invention provide methods for fabricating semiconductor devices which may exhibit reduced interference between adjacent transistors and/or which can apply strain to a channel region.

Additional advantages, subjects, and features of the invention will be set forth in part in the description which follows and in part will become apparent to those having ordinary skill in the art upon examination of the following or may be learned from practice of the invention.

In one aspect of the present invention, there is provided a semiconductor device, the semiconductor device comprising a substrate, an isolation film on the substrate and a fin projecting upwardly from the substrate through a recess in the isolation film. The semiconductor device further includes a gate electrode that crosses the fin, a source/drain formed on a side of the gate electrode, the source/drain including a first film and a second film; and a stress film that is on a side of the fin, the stress film positioned between the isolation film and the source/drain.

In another aspect of the present invention, a fin transistor is provided that includes a fin that projects upwardly from a substrate and extends on the substrate along a first direction. A source/drain is on an upper surface of the fin, the source/drain including a first film that is on the fin and that includes a first stress material that applies a stress to the fin and a second film on the first film opposite the fin, the second film having a different composition than the first film. A gate electrode on the fin and adjacent to the source/drain.

In yet another aspect of the present invention, there is provided a method for fabricating a semiconductor device, the method comprising forming a fin on a substrate; forming an isolation film on the substrate so that an upper portion of the fin is exposed; forming a gate electrode on the isolation film, the gate electrode crossing the fin; forming a spacer on a side surface of the gate electrode; forming a source/drain on the fin and on a side surface of the spacer that is opposite the gate electrode, the source/drain including a first film and a second film; and forming a stress film on an exposed upper portion of a side surface of the fin.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EMBODIMENTS

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the inventive concept to those skilled in the art, and the present inventive concept will only be defined by the appended claims.

It will be understood that when an element or layer is referred to as being "on," "connected to" or "coupled to" another element or layer, it can be directly on or connected to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element discussed below could be termed a second element without departing from the teachings of the present inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises," "includes" and/or "made of," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
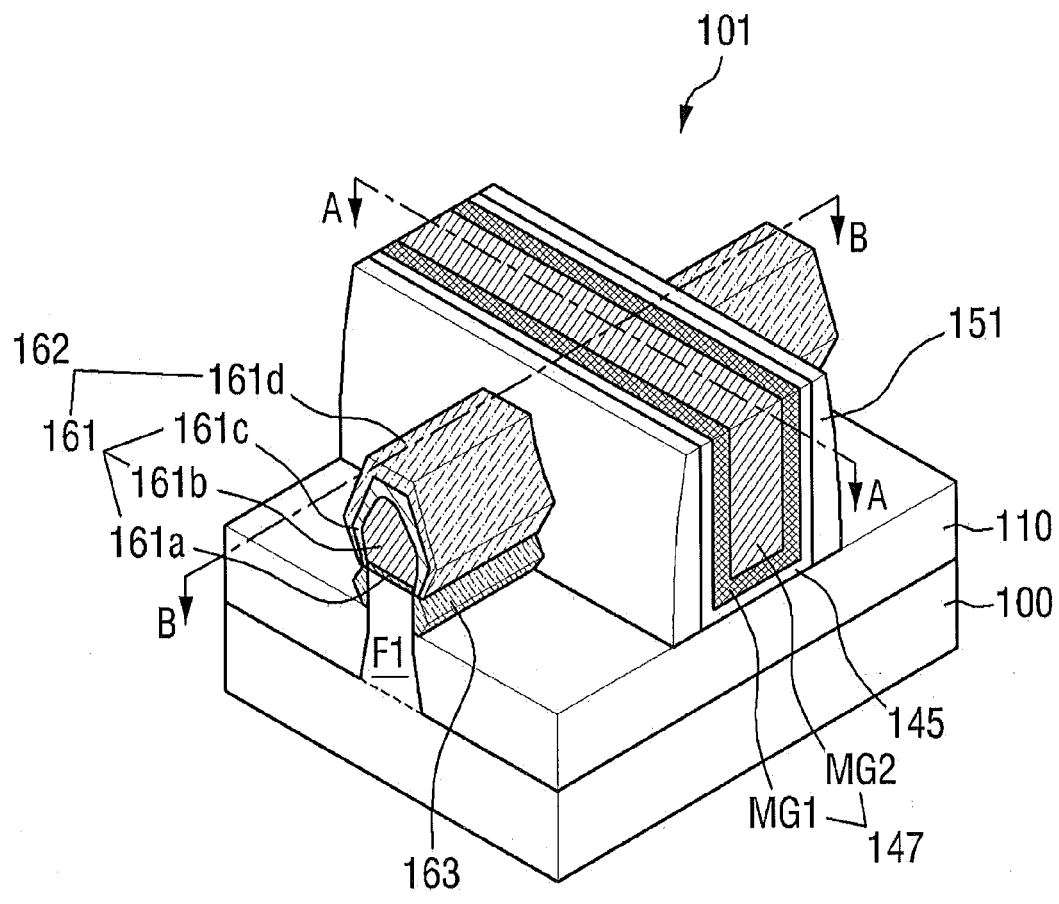
FIG. 1 is a perspective view of a semiconductor device according to a first embodiment of the present invention.
Figure 2:
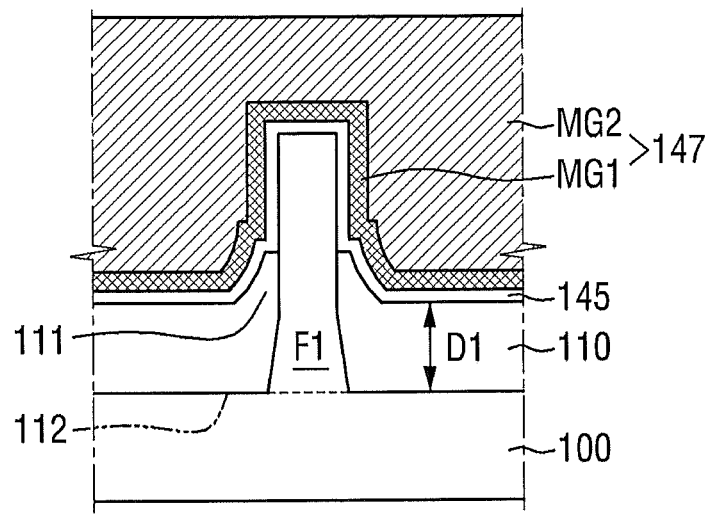
FIG. 2 is a cross-sectional view taken along line A-A of FIG. 1.
Figure 3:
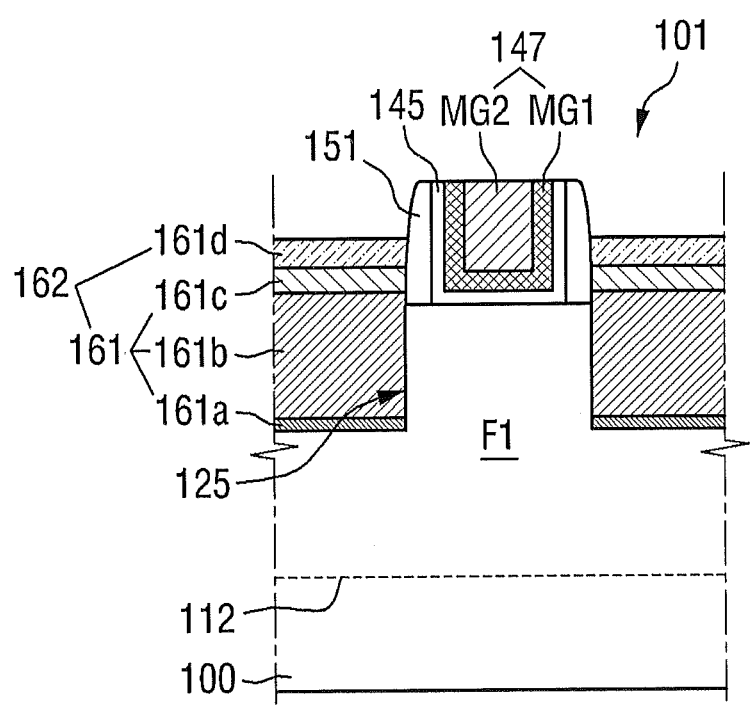
FIG. 3 is a cross-sectional view taken along line B-B of FIG. 1.

Referring to FIGS. 1 to 3, a semiconductor device according to a first embodiment of the present invention will be described.

FIG. 1 is a perspective view of a semiconductor device according to a first embodiment of the present invention. FIG. 2 is a cross-sectional view taken along line A-A of FIG. 1, and FIG. 3 is a cross-sectional view taken along line B-B of FIG. 1.

A fin transistor 101 may include a fin F1, an isolation film 110, a gate electrode 147, a recess 125, and a source/drain 162.

The fin F1 may extend long along a second direction Y on a substrate 100. The fin F1 may be a part of the substrate 100, or may comprise an epitaxial layer that is grown from the substrate 100.

The isolation film 110 may cover a lower part of a side surface of the fin F1. Accordingly, the height taken from an upper surface 112 of the substrate 100 to an upper surface of the isolation film 110 is less than the height taken from the upper surface 112 of the substrate 100 to an upper surface of the fin F1. The isolation film 110 may include silicon oxide, for example, SiO2.

The gate electrode 147 may extend in a first direction X to cross the fin F1.

The gate electrode 147 may include metal layers MG1 and MG2. As illustrated, the gate electrode 147 may include two or more metal layers MG1 and MG2 that are stacked together. The first metal layer MG1 may serve to adjust a work function, and the second metal layer MG2 may serve to fill a space that is formed by the first metal layer MG1. For example, the first metal layer MG1 may include at least one of TiN, TaN, TiC, and TaC, and the second metal layer MG2 may include W or Al. Further, the gate electrode 147 may include Si or SiGe, which are not metals. The first gate electrode 147 may be formed, for example, through a replacement process (that is, the gate electrode 147 may have a gate last structure). In other embodiments, the gate electrode 147 may have, for example, a gate first structure, as will be described in more detail below.

The gate insulating film 145 may be formed between the fin F1 and the gate electrode 147. As illustrated in FIG. 2, the gate insulating film 145 may be formed on an upper surface of the fin F1 and on an upper portion of a side surface of the fin F1. The gate insulating film 145 may be arranged between the gate electrode 147 and the isolation film 110. The isolation film 110 may include a projecting isolation film portion 111 that projects upwardly along the side surface of the fin F1. As shown in FIG. 2, the gate insulating film 145 may be formed on both the isolation film 110 and on the projecting isolation film portion 111. As a result, the gate insulating film 145 may be conformally formed along the isolation film 110, the projecting isolation film portion 111, the upper portion of the side surface of the fin F1 and the upper surface of the fin F1.

The gate insulating film 145 may include a high-k material that has a higher dielectric constant than that of the silicon oxide film. For example, the gate insulating film 145 may include HfO2, ZrO2, or Ta2O5.

Recesses 125 may be formed in the first fin F1 on one or both sides of the gate electrode 147.

The source/drain 162 is formed in the recess 125. The source/drain 162 may be an elevated source/drain. Further, the source/drain 162 and the gate electrode 147 may be insulated from each other by a spacer 151. As shown in FIGS. 1 and 3, source/drains 162 may be provided on each side of the gate electrode 147.

If the fin transistor 101 is a PMOS transistor, the source/drain 162 may include a compressive stress material. For example, the compressive stress material may be a material having a large lattice constant in comparison to Si, and for example, may be SiGe. The compressive stress material may improve mobility of carriers in a channel region by applying compressive stress to the fin F1. The source/drain 162 may be formed by epitaxial growth.

If the fin transistor 101 is an NMOS transistor, the source/drain 162 may include a tensile stress material. For example, the source/drain 162 may include a material having a smaller lattice constant in comparison to Si such as, for example, B. The source/drain 162 may be formed by epitaxial growth.

The description that follows will discuss an embodiment in which the source/drain 162 includes a compressive stress material such as, for example, Ge. It will be appreciated that in other embodiments, the compressive stress material may be replaced with a tensile stress material.

The source/drain 162 may include a plurality of films. Specifically, the source/drain 162 may include a first film 161, and a second film 161d that is formed to cover the first film 161. The second film 161d may be directly on the first film 161. The second film 161d may reduce or prevent etching of the first film 161 when a contact is formed on the source/drain 162. Unlike the second film 161d, the first film 161 may include a first material. The first material is a material that may apply compressive stress to the fin F1. For example, if the first film 161 and the second film 161d include Si, the first material may be a material having a larger lattice constant in comparison to Si, and for example, may be Ge.

The first film 161 may include first to third sub-films 161a, 161b, and 161c. The second sub-film 161b may cover the first sub-film 161a, and the third sub-film 161c may cover the second sub-film 161b. Since the width of the first sub-film 161a is equal to the width of the upper surface of the fin F1 and the second sub-film 161b and the third sub-film 161c are sequentially formed to cover the first sub-film 161a (including side surfaces thereof), the width of a lower surface of the first film 161 may be larger than the width of the upper surface of the fin F1. The first to third sub-films 161a, 161b, and 161c may be formed, for example, through an epitaxial process, and the second and third sub-films 161b and 161c may be formed using the first sub-film 161a as a seed.

The first to third sub-films 161a, 161b, and 161c may contain different densities of the first material. Specifically, the first sub-film 161a may contain a first density of the first material, the second sub-film 161b may contain a second density of the first material, and the third sub-film 161c may contain a third density of the first material. The second density may be higher than both the first density and the third density. For example, the second density may be in the range of 40% to 65%, and the first density and the third density may be in the range of 10% to 30%. The first density and the third density may be equal to each other, or may be different from each other. As the density of the first material that is included in the second sub-film 161b becomes higher, the compressive stress that is applied to the channel region is increased. However, if the first sub-film 161a includes the first material with a density that exceeds the second density, the density of Si in the second sub-film 161b is decreased, and thus the level of the compressive stress by Ge becomes lower. Accordingly, in the case where the second sub-film 161b includes the first material with the second density, the maximum compressive stress can be applied to the channel region in the fin F1.

On the other hand, since etching becomes easier as the density of the first material included in the first film 161 becomes higher, the third sub-film 161c with the third density that is lower than the second density may be formed to cover the second sub-film 161b to protect the second sub-film 161b from being etched. If the second sub-film 161b is etched, the level of the compressive stress that is applied to the channel region becomes lowered.

The first film 161 and the second film 161d may perform in-situ doping of the first material during an epitaxial process.

The spacer 151 may include at least one of a nitride film or an oxynitride film.

The substrate 100 may be made of, for example, one or more semiconductor materials selected from the group of Si, Ge, SiGe, GaP, GaAs, SiC, SiGeC, InAs, and InP. Further, the substrate 100 may be an SOI (Silicon On Insulator) substrate.

A stress film 163 may be formed between the isolation film 110 and the source/drain 162. The stress film 163 may be formed on the side surface of the fin F1, and in comparison to a case where the stress film 163 is not provided, the stress film 163 may apply stronger compressive stress to the channel region of the fin F1. The stress film 163 may be formed through an epitaxial process, and may include the first material. The stress film 163 may include the first material with a density of, for example, 30% to 65%.

A strong compressive stress can be applied to the channel region by the stress film 163, and thus the mobility of the carriers in the channel region can be improved. Since the stress film 163 applies the compressive stress to the channel region together with the source/drain 162, the width of the source/drain 162 may be smaller than the case where the stress film 163 is not provided, and particularly, the width of the source/drain 162 in the first direction X can be reduced. Further, as described above, if the source/drain 162 is formed of a plurality of films, the source/drain 162 can be formed with a width that is smaller than that in the case where the source/drain 162 is formed of one film.

If the source/drain 162 is formed with a reduced width, a bridge between the source/drain 162 and a peripheral source/drain can be reduced or prevented, and the occurrence of parasitic capacitance can be reduced.

Figure 4:
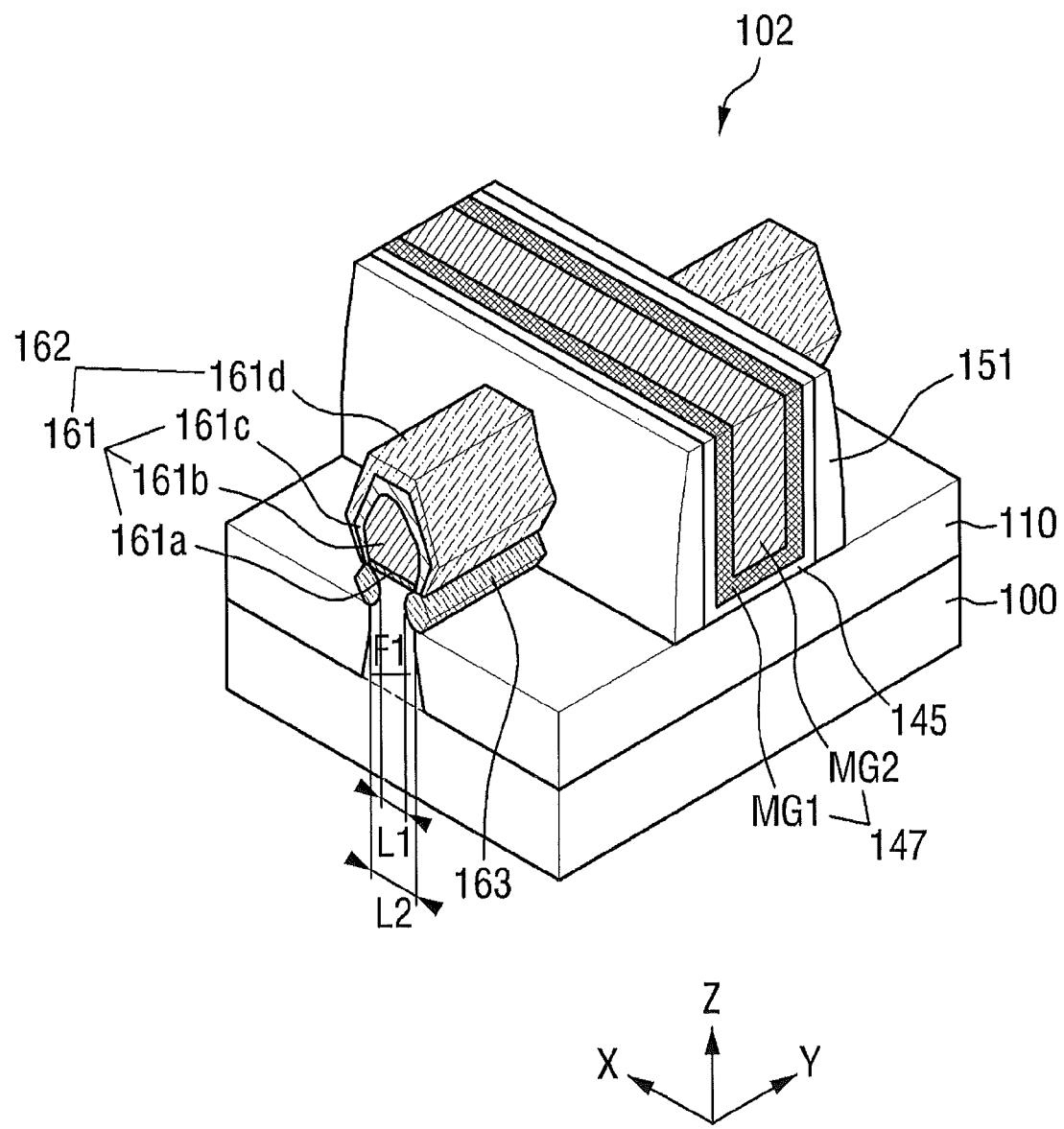
FIG. 4 is a perspective view of a semiconductor device according to a second embodiment of the present invention.

Referring to FIG. 4, a semiconductor device according to a second embodiment of the present invention will be described. The discussion of the second embodiment below will focus on aspects that differ from the first embodiment, and explanation of aspects that are the same will generally be omitted.

FIG. 4 is a perspective view of a semiconductor device 102 according to a second embodiment of the present invention.

In the semiconductor device 102 according to the second embodiment of the present invention, unlike the semiconductor device 101 according to the first embodiment of the present invention, the side surface of the fin F1 that projects onto the isolation film 110 is partially etched. Accordingly, a first width L1 of the fin F1, that is, the shortest distance between the stress films 163, is smaller than a second width L2 that is the width of the lower surface of the first sub-film 161a.

Since the volume of the stress film 163 may be increased by as much as the etched portion of the side surface of the fin F1, the level of the compressive stress which the stress film 163 applies to the channel region may be increased.

Figure 5:
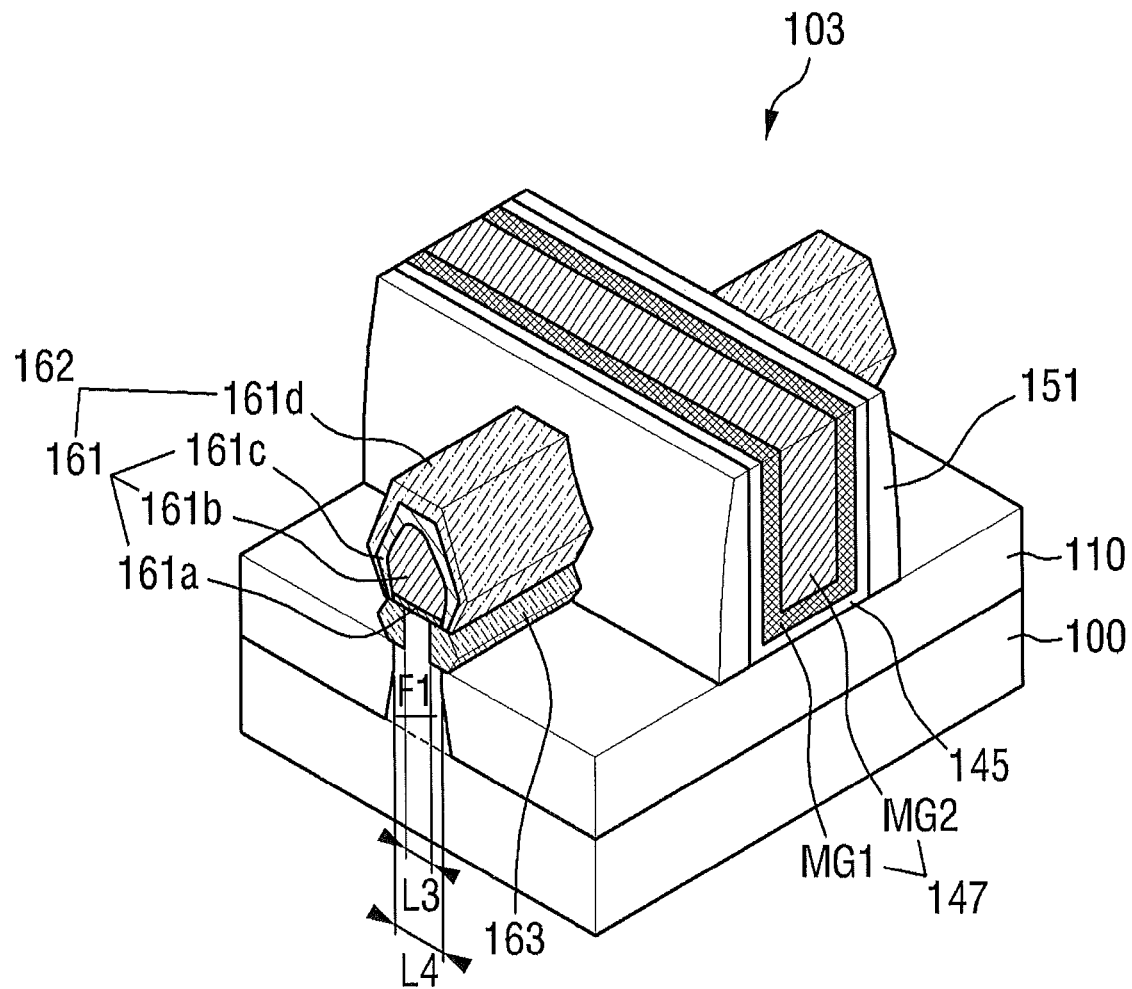
FIG. 5 is a perspective view of a semiconductor device according to a third embodiment of the present invention.

Referring to FIG. 5, a semiconductor device according to a third embodiment of the present invention will be described. The discussion of the third embodiment below will focus on aspects that differ from the first and second embodiments, and explanation of aspects that are the same will generally be omitted.

FIG. 5 is a perspective view of a semiconductor device 103 according to a third embodiment of the present invention.

In the semiconductor device 103 according to the third embodiment of the present invention, like the semiconductor device 102 according to the second embodiment of the present invention, the side surface of the fin F1 that projects onto the isolation film 110 is partially etched. However, in the semiconductor device 102 according to the second embodiment of the present invention, the etched surface of the fin F1 is a curved surface, whereas in the semiconductor device 103 according to the third embodiment of the present invention, the etched surface of the fin F1 is a flat surface in a third direction Z. Accordingly, a first width L3 of the fin F1 that projects into the isolation film 110, that is, the distance between the stress films 163, is constant. The first width L3 is smaller than a second width L4 that is the length of the lower surface of the first sub-film 161a.

Since the volume of the stress film 163 is increased by as much as the etched portion of the side surface of the fin F1, the level of the compressive stress which the stress film 163 applies to the channel region may be increased.

Figure 6:
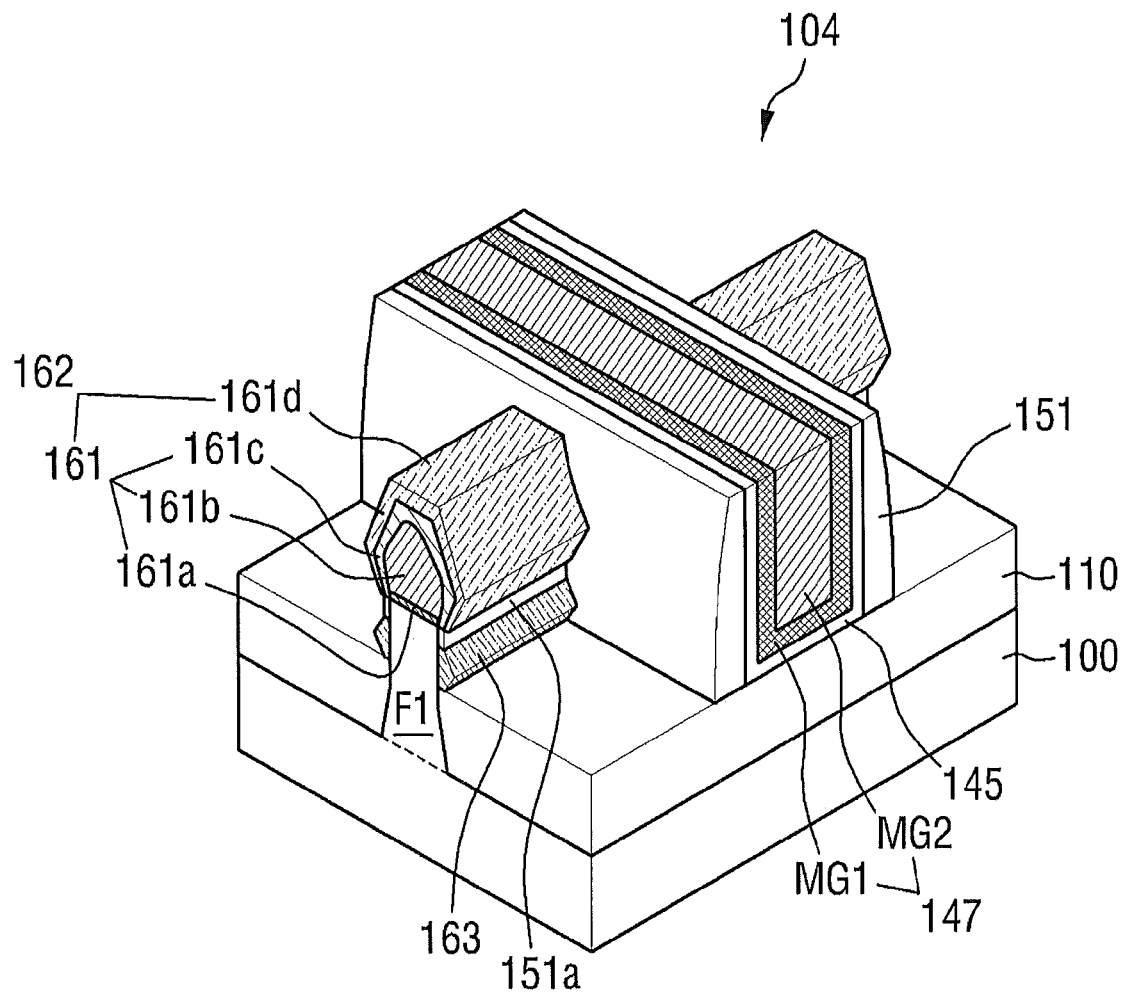
FIG. 6 is a perspective view of a semiconductor device according to a fourth embodiment of the present invention.

Referring to FIG. 6, a semiconductor device according to a fourth embodiment of the present invention will be described. The discussion of the fourth embodiment below will focus on aspects that differ from the first through third embodiments, and explanation of aspects that are the same will generally be omitted.

FIG. 6 is a perspective view of a semiconductor device 104 according to a fourth embodiment of the present invention.

Unlike the semiconductor device 101 according to the first embodiment of the present invention, the semiconductor device 104 according to the fourth embodiment of the present invention includes a fin spacer 151a. The fin spacer 151a may be formed between the stress film 163 and the source/drain 162. The fin spacer 151a may exist in the case where the spacer 151 is not completely etched when the recess (125 in FIG. 3) is formed in the process of fabricating the semiconductor device 104. This will be described in detail later.

Figure 7:
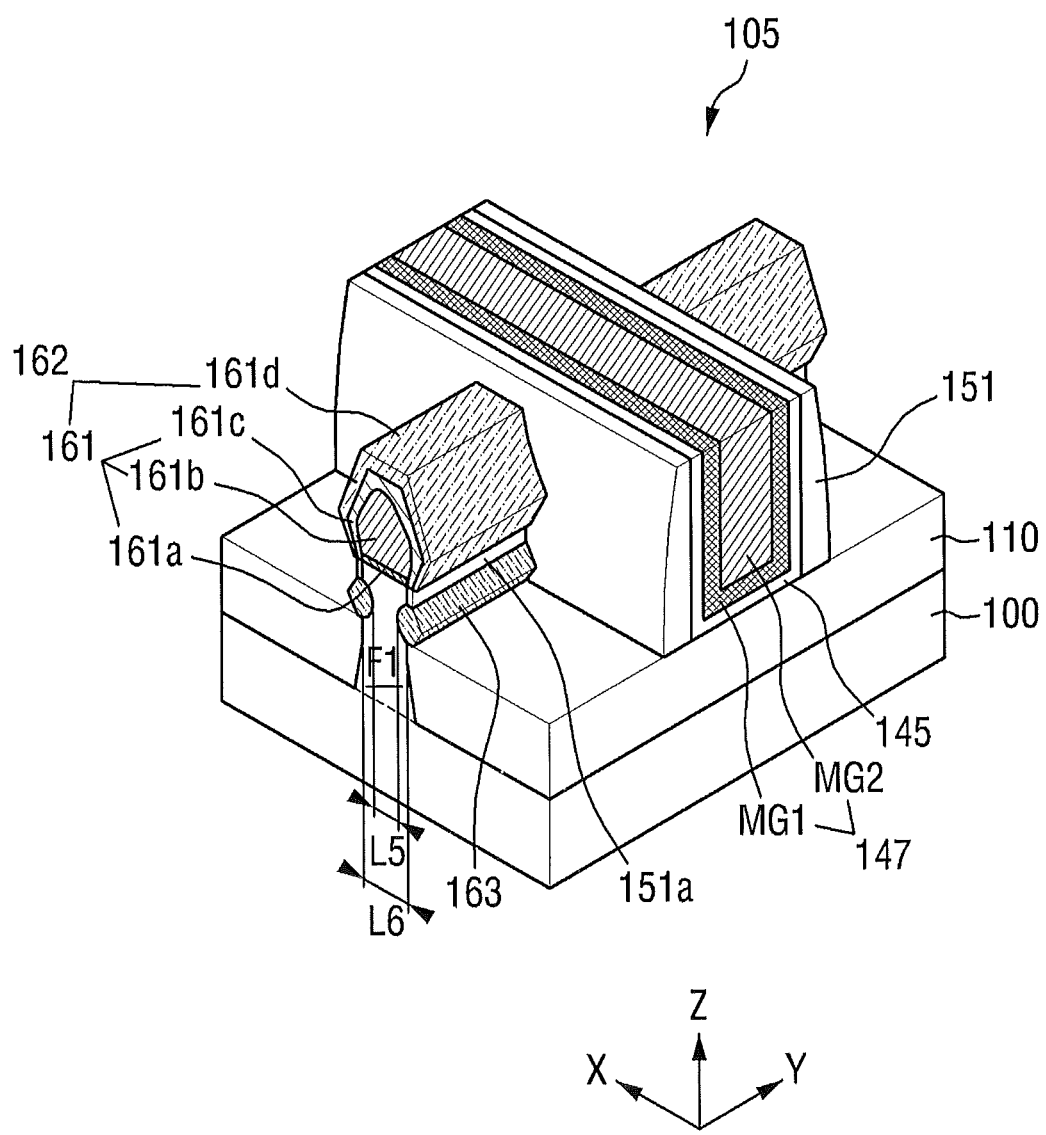
FIG. 7 is a perspective view of a semiconductor device according to a fifth embodiment of the present invention.

Referring to FIG. 7, a semiconductor device according to a fifth embodiment of the present invention will be described. The discussion of the fifth embodiment below will focus on aspects that differ from the first through fourth embodiments, and explanation of aspects that are the same will generally be omitted.

FIG. 7 is a perspective view of a semiconductor device 105 according to a fifth embodiment of the present invention.

In the semiconductor device 105 according to the fifth embodiment of the present invention, like the semiconductor device 102 according to the second embodiment of the present invention, the side surface of the fin F1 that projects onto the isolation film 110 is partially etched. Accordingly, a first width L5 of the fin F1, that is, the shortest distance between the stress films 163, is smaller than a second width L6 that is the width of the lower surface of the first sub-film 161a. However, according to the semiconductor device 105 according to the fifth embodiment of the present invention, unlike the semiconductor device 102 according to the second embodiment of the present invention, a fin spacer 151a may be formed between the stress film 163 and the source/drain 162.

Figure 8:
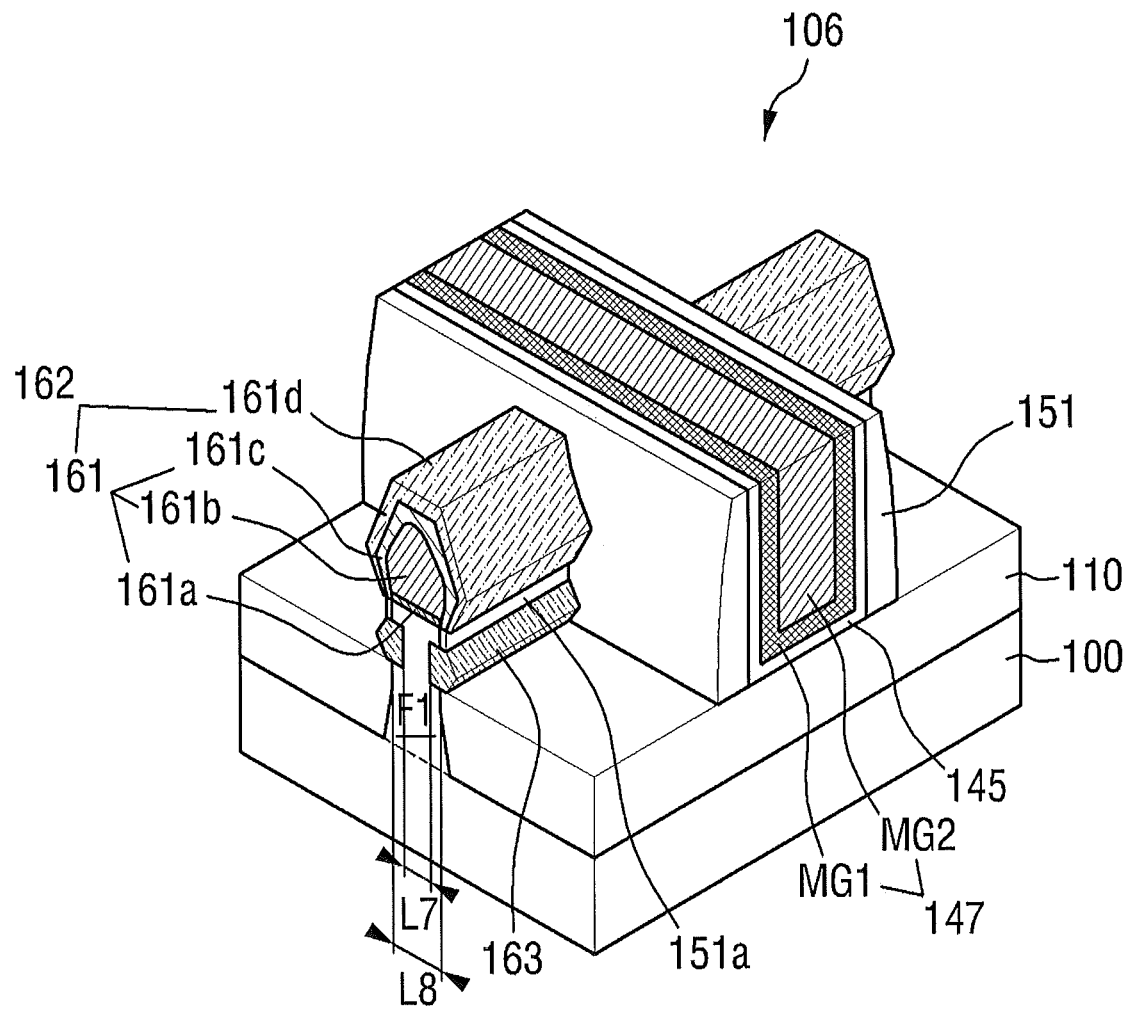
FIG. 8 is a perspective view of a semiconductor device according to a sixth embodiment of the present invention.

Referring to FIG. 8, a semiconductor device according to a sixth embodiment of the present invention will be described. The discussion of the sixth embodiment below will focus on aspects that differ from the first through fifth embodiments, and explanation of aspects that are the same will generally be omitted.

FIG. 8 is a perspective view of a semiconductor device 106 according to a sixth embodiment of the present invention.

In the semiconductor device 106 according to the sixth embodiment of the present invention, like the semiconductor device 103 according to the third embodiment of the present invention, the side surface of the fin F1 that projects into the isolation film 110 is partially etched, and the etched surface is a flat surface in a third direction Z. Accordingly, a first width L7 of the fin F1 that projects into the isolation film 110 is constant. The first width L7 is smaller than a second width L8 that is the length of the lower surface of the first sub-film 161a. However, in the semiconductor device 106 according to the sixth embodiment of the present invention, unlike the semiconductor device 103 according to the third embodiment of the present invention, a fin spacer 151a may be formed between the stress film 163 and the source/drain 162.

Figure 9:
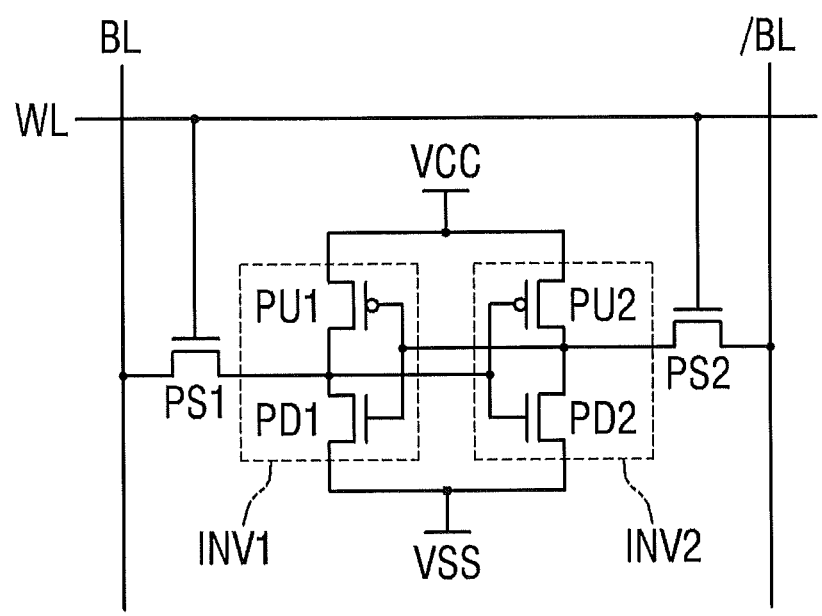
FIGS. 9 and 10 are a circuit diagram and a layout diagram explaining a semiconductor device according to a seventh embodiment of the present invention.
Figure 10:
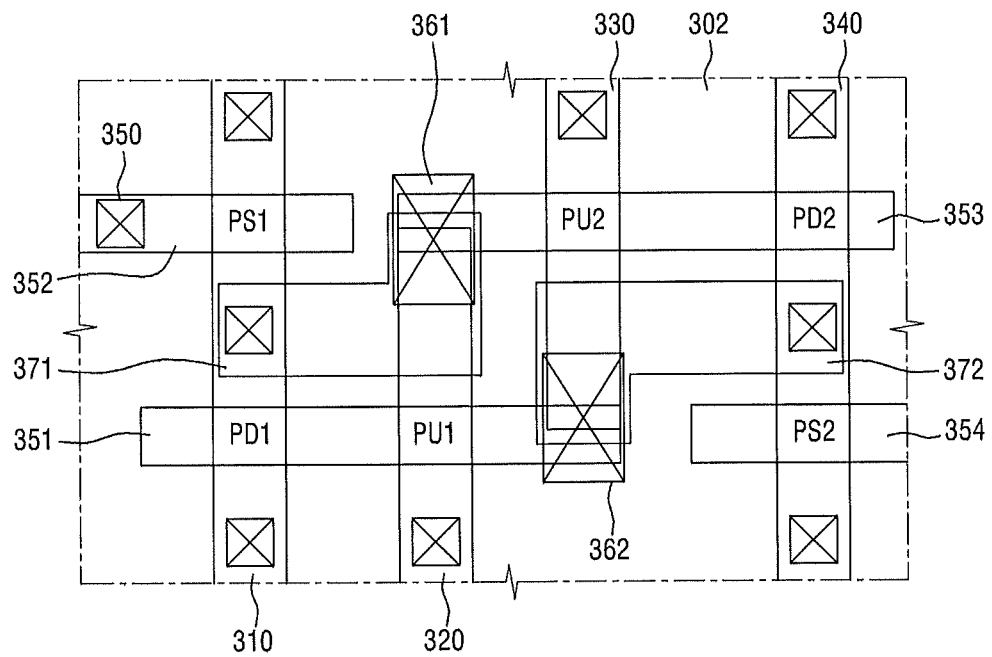
Figure 11:
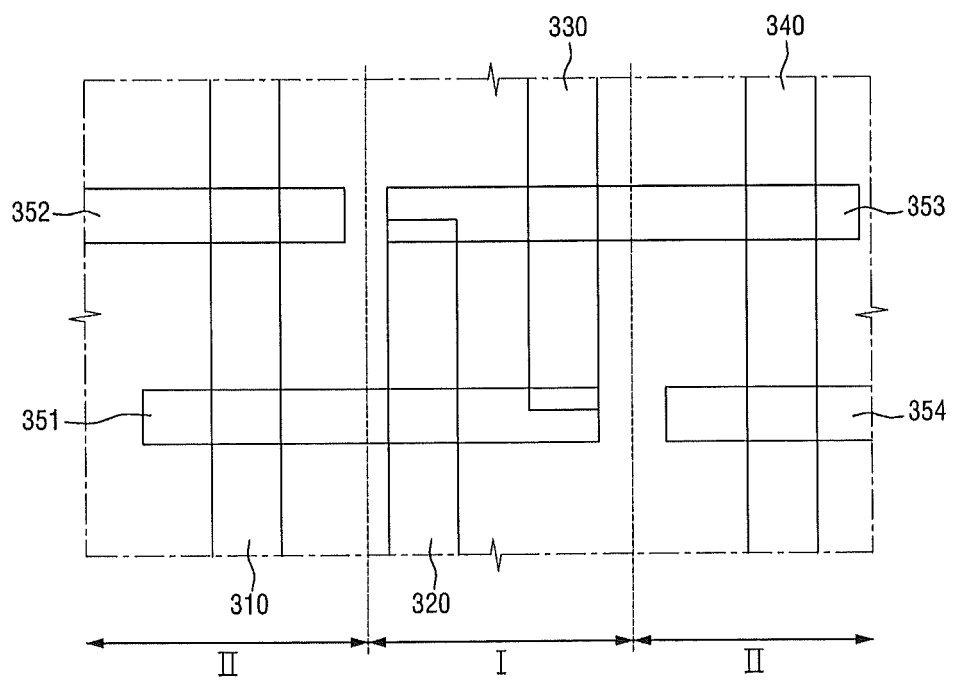
FIG. 11 is a layout diagram of the semiconductor device of FIG. 10 with only fins and gate electrodes depicted.

Referring to FIGS. 9 to 11, a semiconductor device according to a seventh embodiment of the present invention will be described.

FIGS. 9 and 10 are a circuit diagram and a layout diagram, respectively, that illustrate an example semiconductor device that is implemented using the fin transistors according to embodiments of the present invention. FIG. 11 is a layout diagram of the semiconductor device of FIG. 10 with only fins and gate electrodes depicted. The example semiconductor device depicted in FIGS. 9-11 is a SRAM device. However, it will be appreciated that the fin transistors according to embodiments of the present invention are applicable to any device that includes transistors such as general logic devices, memory devices, etc.

Referring to FIG. 9, it can be seen that the semiconductor device may include a pair of inverters INV1 and INV2 that are connected in parallel between a power supply node Vcc and a ground node Vss, and a first path transistor PS1 and a second pass transistor PS2 that are connected to output nodes of the respective inverters INV1 and INV2. The first pass transistor PS1 and the second pass transistor PS2 may be connected to a bit line BL and a complementary bit line BL/, respectively. Gates of the first pass transistor PS1 and the second pass transistor PS2 may be connected to a word line WL.

The first inverter INV1 includes a first pull-up transistor PU1 and a first pull-down transistor PD1 which are connected in series, and the second inverter INV2 includes a second pull-up transistor PU2 and a second pull-down transistor PD2 which are connected in series. The first pull-up transistor PU1 and the second pull-up transistor PU2 may be PMOS transistors, and the first pull-down transistor PD1 and the second pull-down transistor PD2 may be NMOS transistors.

The first inverter INV1 and the second inverter INV2 may constitute a latch circuit in a manner that an input node of the first inverter INV1 is connected to an output node of the second inverter INV2, and an input node of the second inverter INV2 is connected to an output node of the first inverter INV1.

As shown in FIGS. 10-11, a first fin 310, a second fin 320, a third fin 330, and a fourth fin 340, which are spaced apart from each other, are each formed to extend in a first direction (for example, upper/lower direction in FIG. 10). The length of the second fin 320 and the third fin 330 may be shorter than the length of the first fin 310 and the fourth fin 340, as is shown in FIG. 11.

A first gate electrode 351, a second gate electrode 352, a third gate electrode 353, and a fourth gate electrode 354 extend in a second direction (for example, right/left direction in FIG. 10), and cross the first to fourth fins 310 to 340. The first gate electrode 351 may completely cross the first fin 310 and the second fin 320 and may overlap a part of one end of the third fin 330. The third gate electrode 353 may completely cross the fourth fin 340 and the third fin 330 and may overlap a part of one end of the second fin 320. The second gate electrode 352 and the fourth gate electrode 354 may cross the first fin 310 and the fourth fin 340, respectively.

As illustrated in FIG. 10, the first pull-up transistor PU1 is formed in a region where the first gate electrode 351 and the second fin 320 cross each other, the first pull-down transistor PD1 is formed in a region where the first gate electrode 351 and the first fin 310 cross each other, and the first pass transistor PS1 is formed in a region where the second gate electrode 352 and the first fin 310 cross each other. The second pull-up transistor PU2 is formed in a region where the third gate electrode 353 and the third fin 330 cross each other, the second pull-down transistor PD2 is formed in a region where the third gate electrode 353 and the fourth fin 340 cross each other, and the second pass transistor PS2 is formed in a region where the fourth gate electrode 354 and the fourth fin 340 cross each other.

Although not clearly illustrated, a recess may be formed on both sides of each region where the first to fourth gate electrodes 351 to 354 and the first to fourth fins 310, 320, 330, and 340 cross each other, and a source/drain may be formed in each such recess.

As is also illustrated in FIG. 10, a plurality of contacts 350 may be formed. In addition, a shared contact 361 electrically connects the second fin 320, the third gate electrode 353, and a wiring 371 to each other. A shared contact 362 electrically connects the third fin 330, the first gate electrode 351, and a wiring 372 to each other.

The first pull-up transistor PU1 and the second pull-up transistor PU2 may be implemented as fin transistors such as, for example, the fin transistors according to the first to sixth embodiments of the present invention, and may have one of the configurations described above with reference to FIGS. 1 to 8.

Referring to FIGS. 12 to 24, a method for fabricating a semiconductor device according to the first embodiment of the present invention will be described. In the description that follows, it is assumed that a PMOS transistor is fabricated so that the first material is a compressive stress material.

Figure 12:
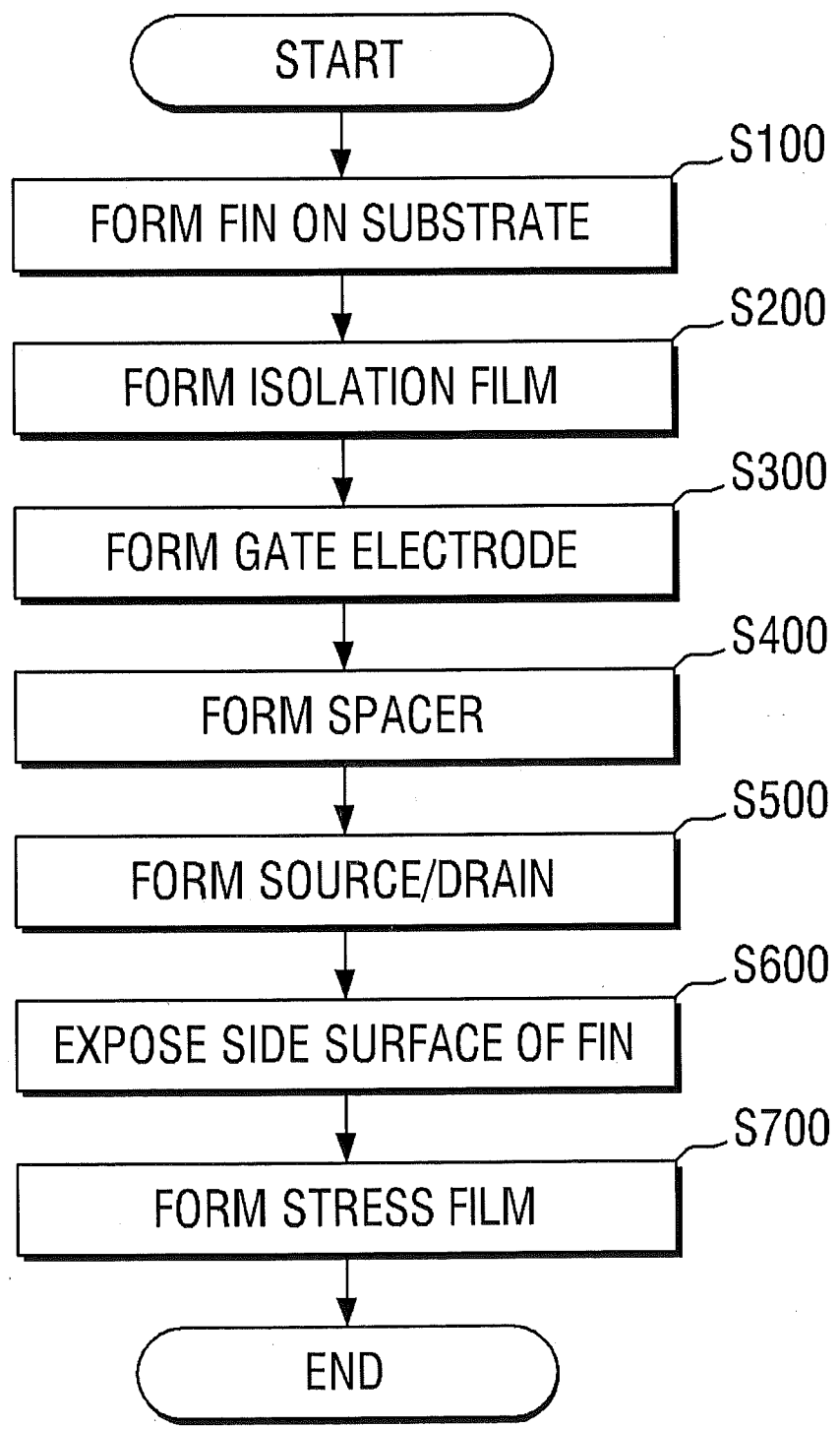
FIG. 12 is a flowchart of a method for fabricating a semiconductor device according to the first embodiment of the present invention.

FIG. 12 is a flowchart of a method for fabricating a semiconductor device according to the first embodiment of the present invention. FIGS. 13 to 21 and 23-24 are perspective views of the semiconductor device at intermediate steps in the method for fabricating the semiconductor device according to the first embodiment of the present invention. FIG. 22 is a cross-sectional view taken along the line C-C of FIG. 21.

Figure 13:
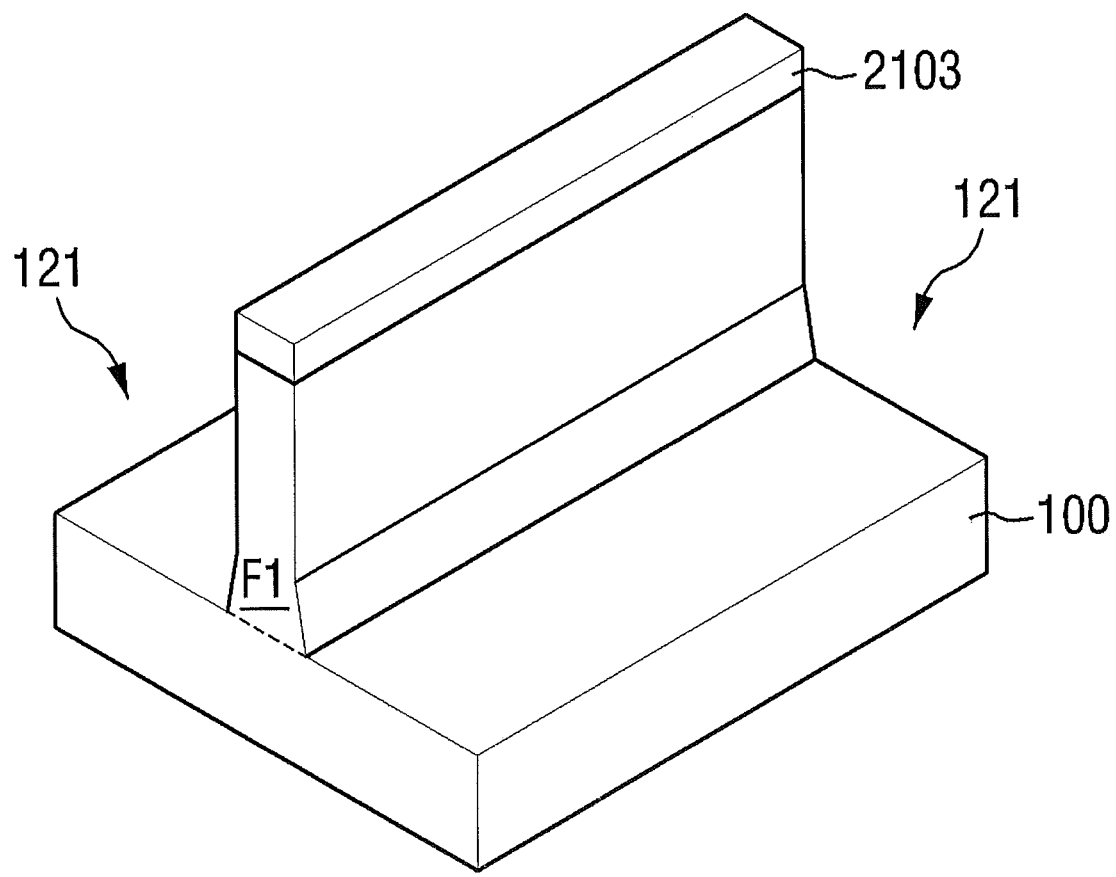
FIGS. 13 to 24 are views of devices formed in intermediate steps of a method for fabricating a semiconductor device according to the first embodiment of the present invention.

First, referring to FIGS. 12 and 13, a fin F1 is formed on a substrate 100 (S100).

Specifically, after a mask pattern 2103 is formed on the substrate 100, the fin F1 is formed via an etching process. The fin F1 may extend along a second direction Y. Trenches 121 may be formed on each side of the fin F1. The mask pattern 2103 may be formed of for example, a material that includes at least one of a silicon oxide film, a silicon nitride film, and a silicon oxynitride film.

Figure 14:
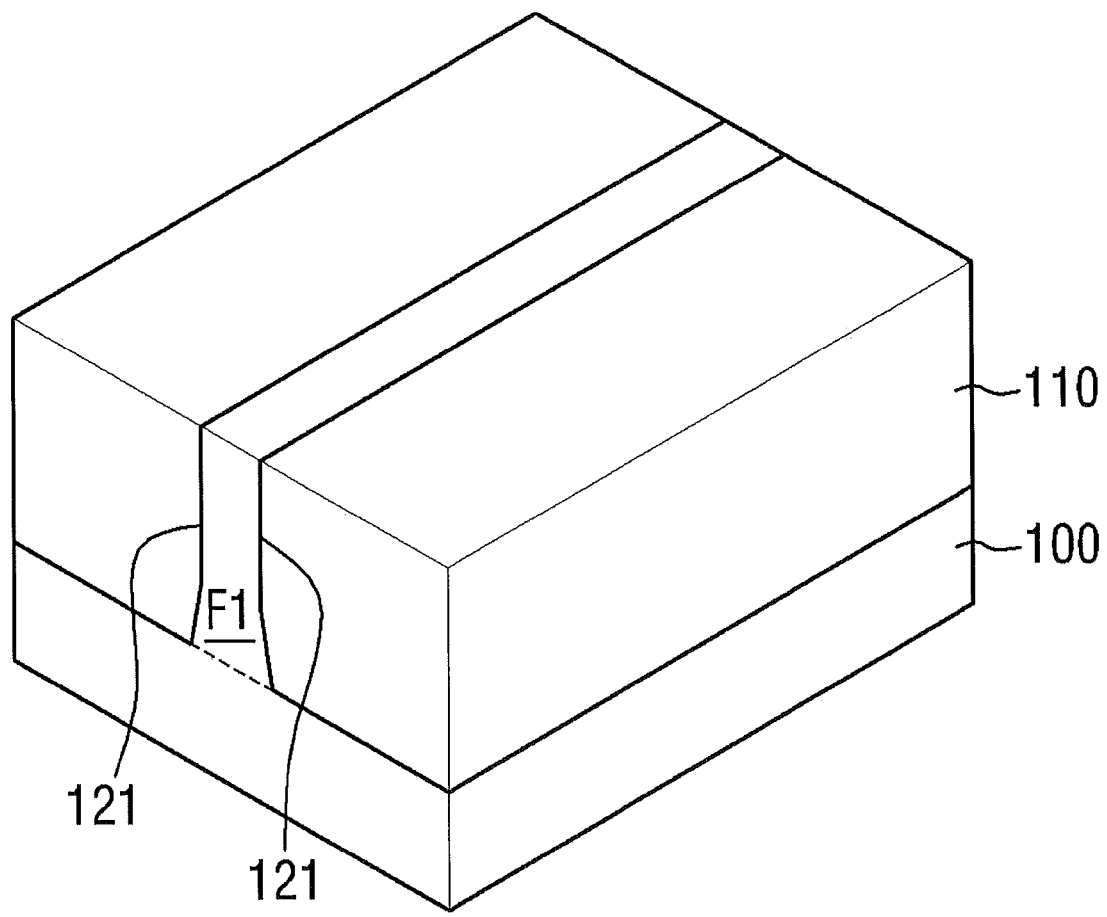
Figure 15:
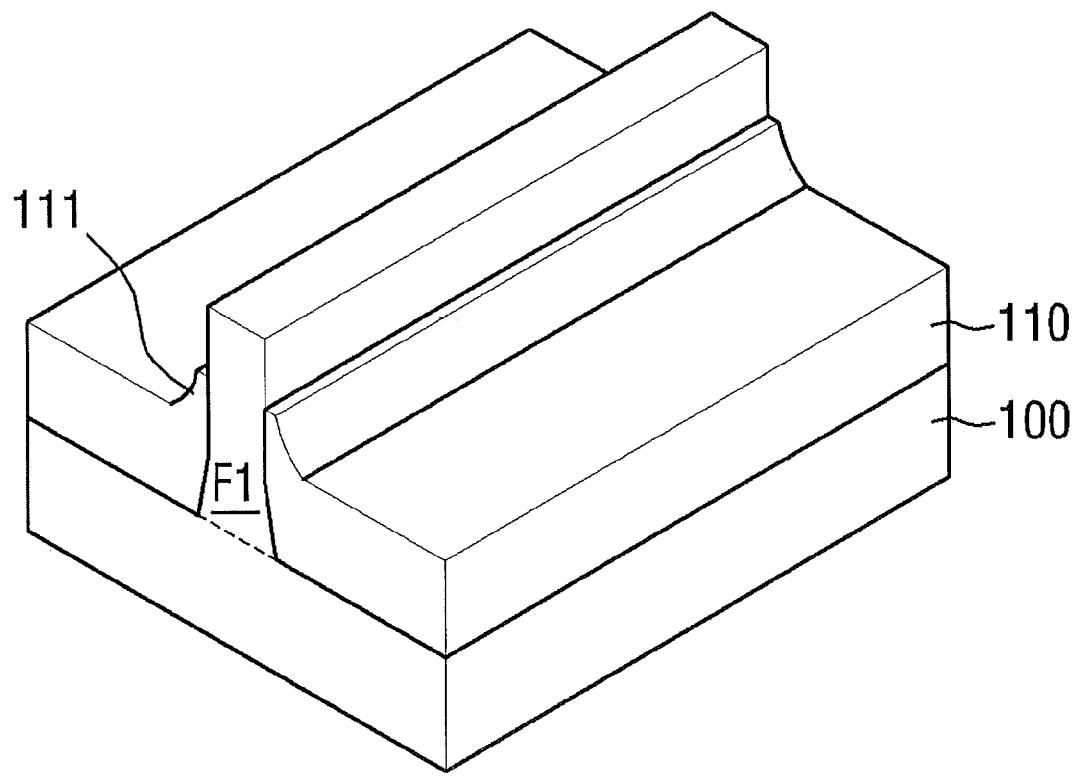

Referring to FIGS. 12, 14, and 15, an isolation film 110 is formed on the substrate 100 so that an upper portion of the fin F1 is exposed (S200). As shown in FIG. 14, the isolation film 110 may fill the trenches 121. The isolation film 110 may be formed of, for example, a material that includes at least one of a silicon oxide film, a silicon nitride film, and a silicon oxynitride film. As shown in FIG. 15, the upper portion of the fin F1 may then be exposed by recessing an upper portion of the isolation film 110 using, for example, a selective etching process.

When the recess process is performed, a portion of the isolation film 110 on a side surface of the fin F1 may not be etched. Accordingly, on part of the side surface of the fin F1, a projecting isolation film portion 111 may project from the isolation film 110.

The mask pattern 2103 may be removed before the isolation film 110 is formed, or may be removed after the recess process.

In other embodiments, the portion of the fin F1 that projects above the isolation film 110 may be formed by an epitaxial process. Specifically, after the isolation film 110 is formed, the portion of the fin F1 that projects above the isolation film 110 may be formed through the epitaxial process, in which the upper surface of the fin F1 that is exposed by the isolation film 110 is used as a seed. In such embodiments, the recess process may be omitted.

The fin F1 may be doped with impurities to set or adjust a threshold voltage of the fin transistor 101. If the fin transistor 101 is an NMOS transistor, the doped impurity may be, for example, boron (B). If the fin transistor 101 is a PMOS transistor, the doped impurity may be, for example, phosphorous (P) or arsenic (As).

Figure 16:
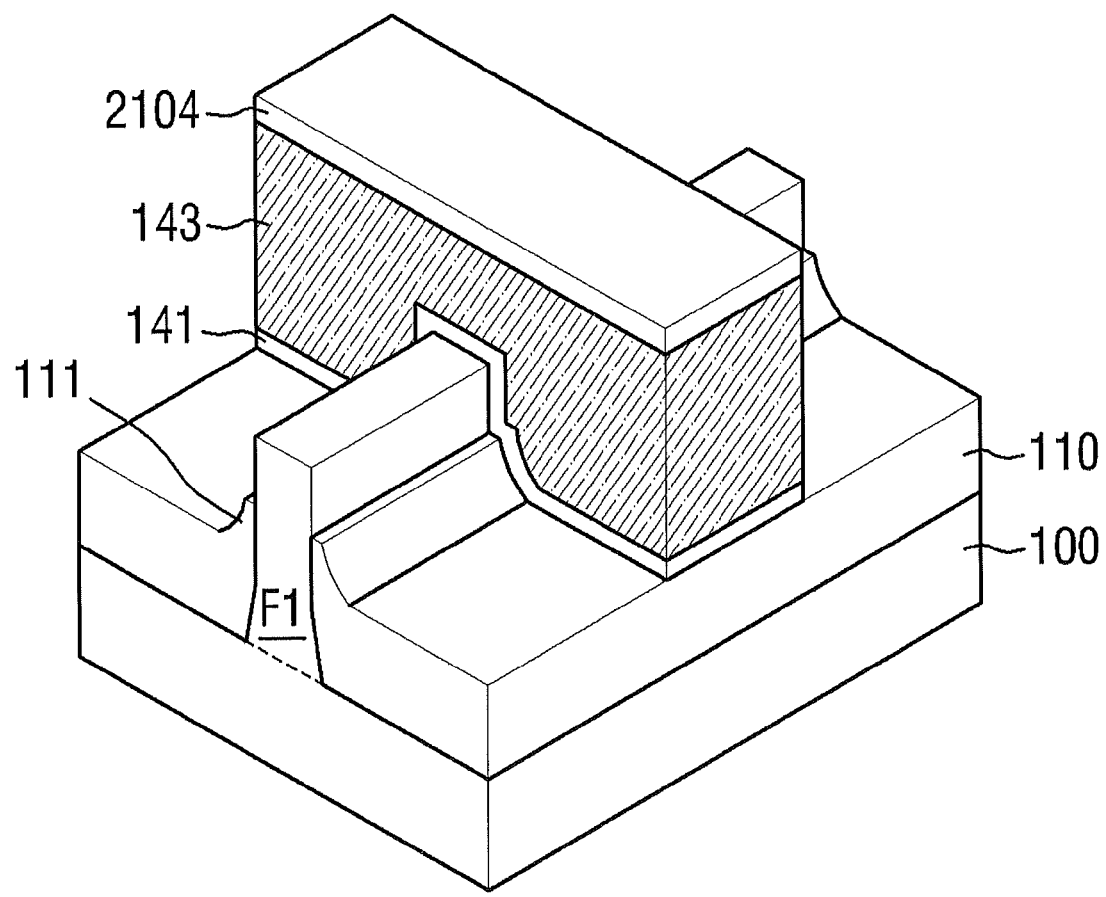
Figure 17:
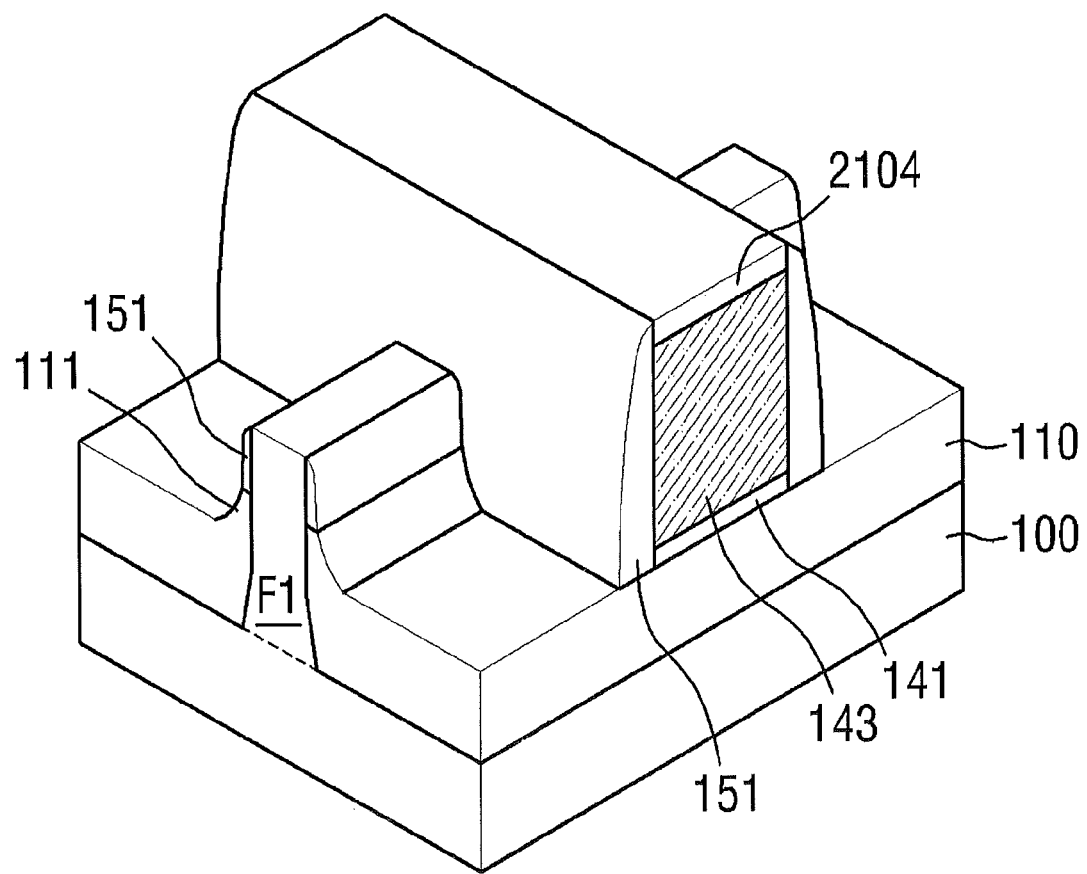

Then, referring to FIGS. 12 and 16, a dummy gate insulating film 141 and a dummy gate electrode 143, which extend in the first direction X to cross the fin F1, are formed. The dummy gate insulating film 141 and the dummy gate electrode 143 may be formed via an etching process using the mask pattern 2104 (S300).

For example, the dummy gate insulating film 141 may be a silicon oxide film, and the dummy gate electrode 143 may be made of polysilicon.

In other embodiments, unlike FIG. 16, the gate insulating film and the gate electrode may be formed without forming the dummy gate insulating film 141 and the dummy gate electrode 143. That is, a gate first process may be performed in which the gate of the fin transistor 101 is formed without first forming a dummy gate structure. In embodiments where a gate first process is used, the gate insulating film may be made of, for example, silicon oxide, silicon nitride, SiON, GexOyNz, GexSiyOz, a high-k material, a combination thereof, or a stacked film in which the above materials are stacked in order. Here, the high-k material may be $HfO_2$, $ZrO_2$, $Al_2O_3$, $Ta_2O_5$, hafnium silicate, zirconium silicate, or a combination thereof, but is not limited thereto. The gate electrode may be poly-Si, poly-SiGe, poly-Si doped with impurities, a metal, such as Ta, TaN, TaSiN, TiN, Mo, Ru, Ni, and NiSi, a single film such as metal silicide, or a stacked film combining the above materials, but is not limited thereto.

Figure 18:
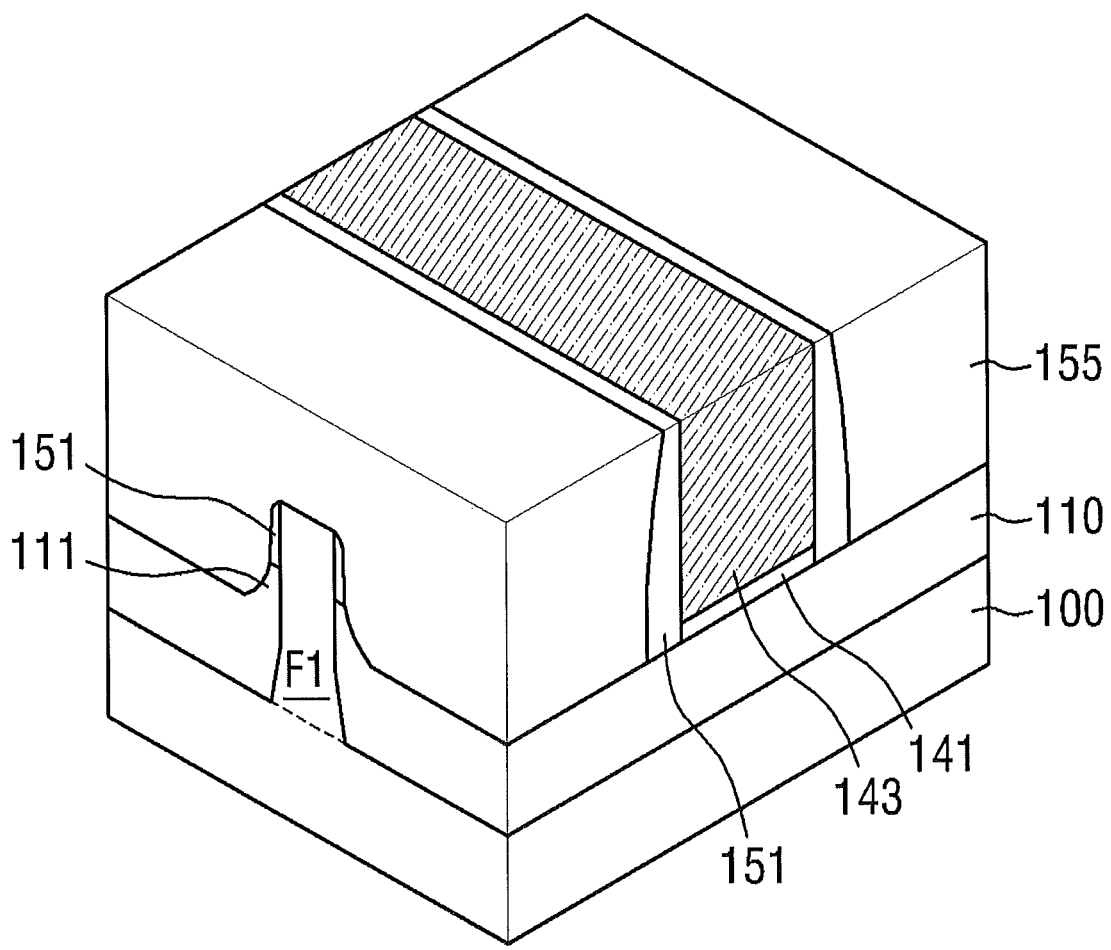
Figure 18:
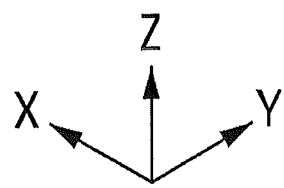
Figure 19:
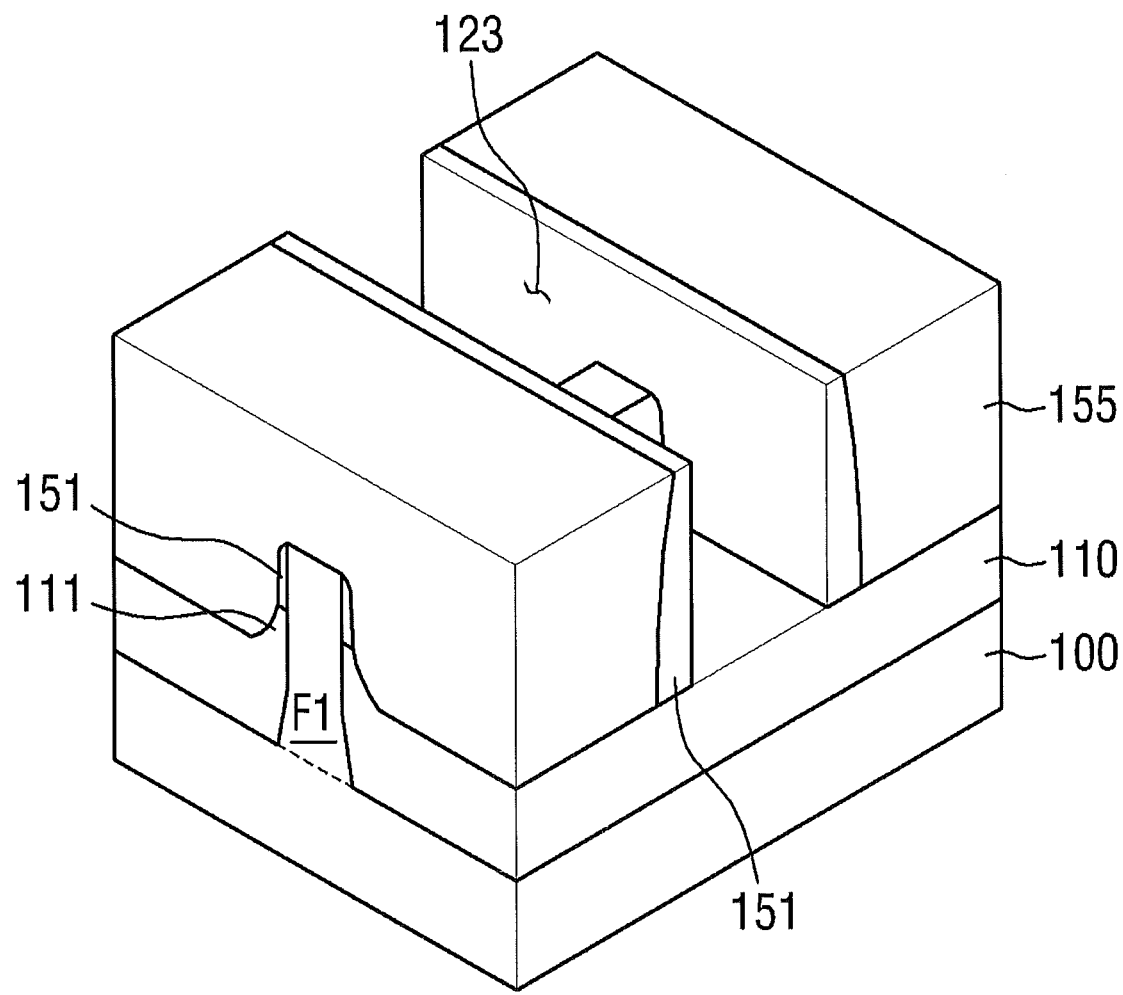
Figure 20:
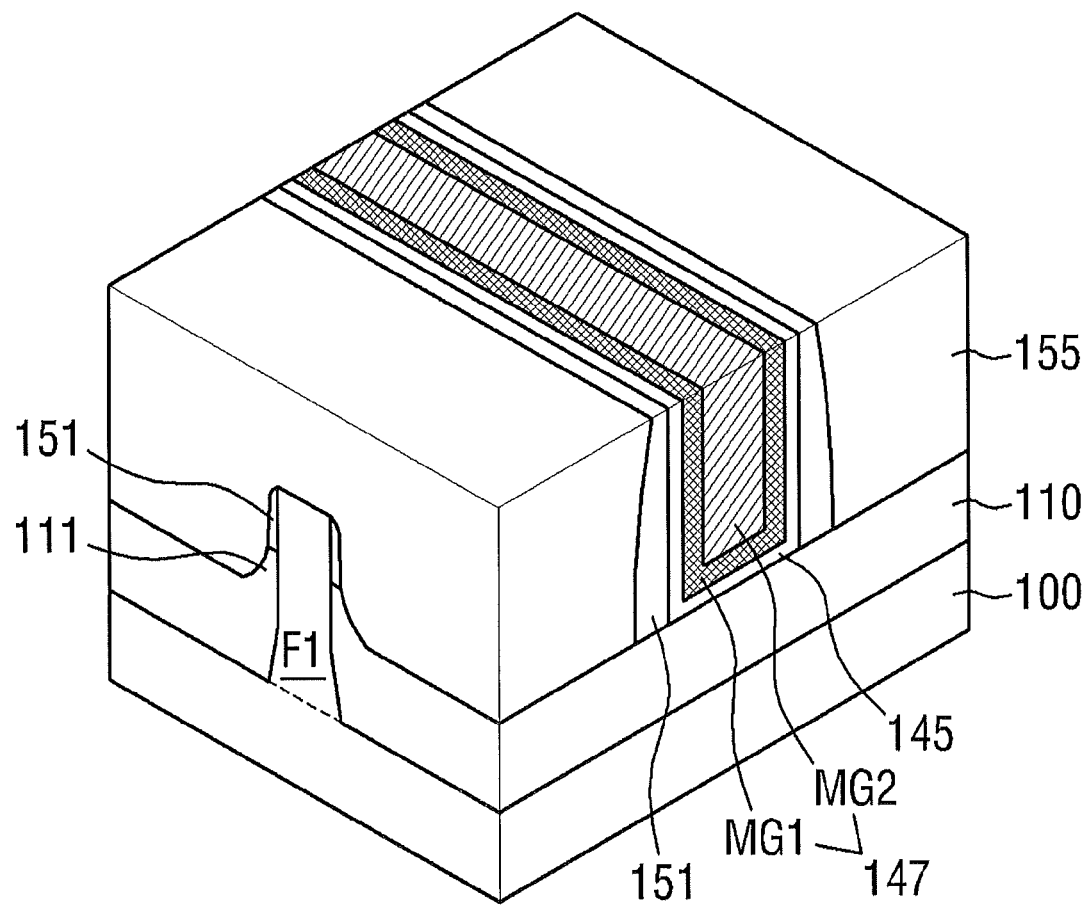

In embodiments where a gate first process is used, the processes illustrated in FIGS. 18 to 20 may be omitted.

Then, referring to FIGS. 12 to 17, a spacer 151 is formed on a side wall of the dummy gate electrode 143 and on a side wall of the fin F1 (S400).

In example embodiments, the spacer 151 may be formed by forming an insulating film on the structure of FIG. 16 and then performing an etch back process. An upper surface of the mask pattern 2104 and an upper surface of the fin F1 may be left exposed by the spacer 151. The spacer 151 may be, for example, a silicon nitride film or a silicon oxynitride film.

Referring to FIG. 18, after the spacer 151 is formed, an interlayer insulating film 155 is formed on the device. The interlayer insulating film 155 may be, for example, a silicon oxide film. Next, the interlayer insulating film 155 is planarized so that the mask pattern 2104 is removed and the upper surface of the dummy gate electrode 143 is exposed.

Referring to FIG. 19, the dummy gate insulating film 141 and the dummy gate electrode 143 are removed using any appropriate process such as an etching process to form a trench 123 that exposes the isolation film 110.

Referring to FIG. 20, a gate insulating film 145 and a gate electrode 147 are formed in the trench 123.

The gate insulating film 145 may include a high-k material that has a higher dielectric constant than that of the silicon oxide film. For example, the gate insulating film 145 may include HfO2, ZrO2, or Ta2O5. The gate insulating film 145 may be substantially conformally formed along the side wall and the lower surface of the trench 123.

As illustrated, the gate electrode 147 may include two or more stacked metal layers MG1 and MG2. The first metal layer MG1 may serve to adjust the work function, and the second metal layer MG2 may serve to fill a space that is formed by the first metal layer MG1. For example, the first metal layer MG1 may include at least one of TiN, TaN, TiC, and TaC. The second metal layer MG2 may include W or Al. In some embodiments, the gate electrode 147 may be made of Si or SiGe, which is not metal.

Next, referring to FIGS. 12 and 21 to 23, a source/drain 162 that includes first and second films 161 and 161d is formed on one or both sides of the gate electrode 147 by recessing the upper portion of the fin F1 (S500).

Figure 21:
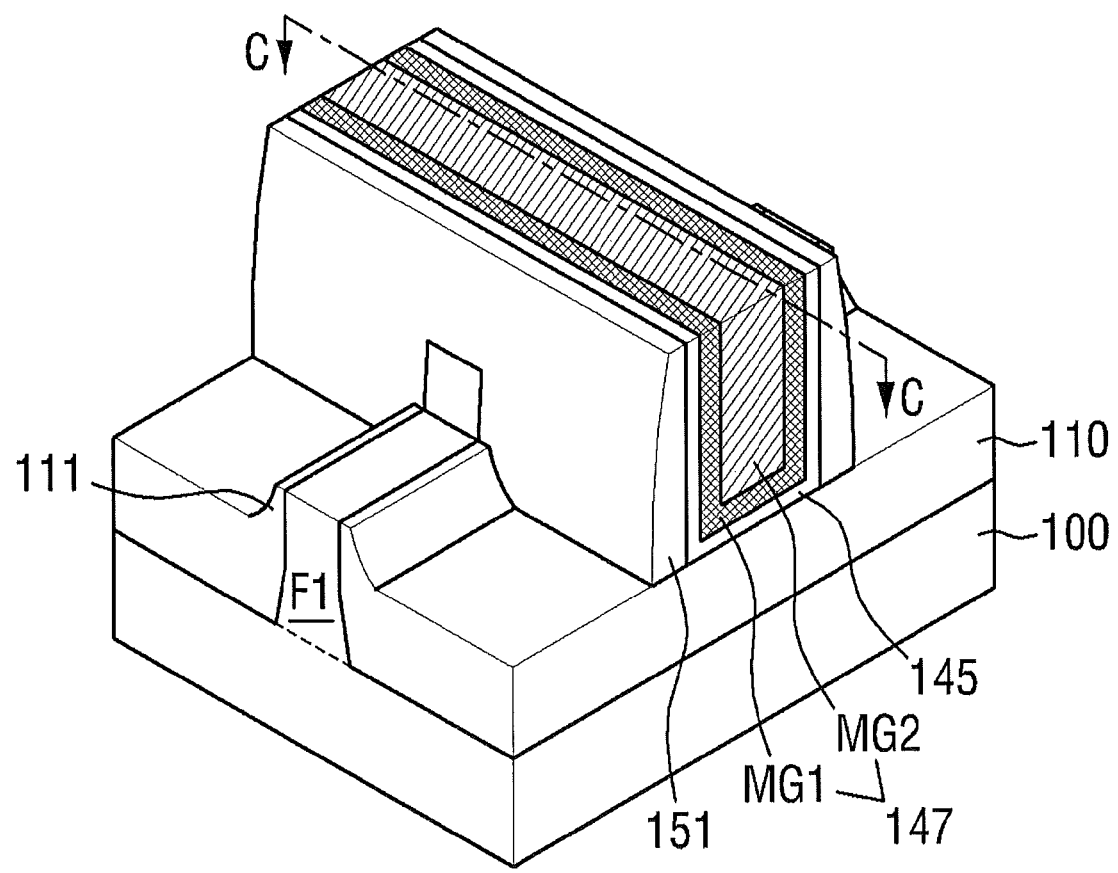
Figure 22:
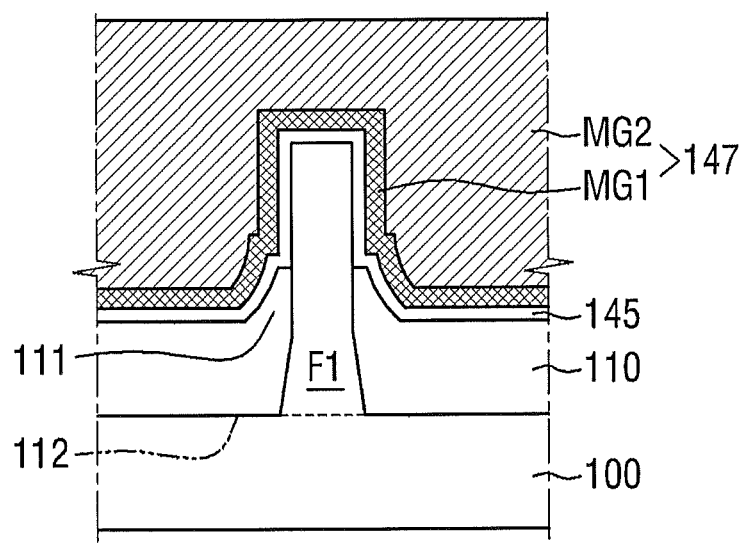

Referring to FIG. 21, a recess 125 is formed in the fin F1 on both sides of the gate electrode 147. The recess 125 may be formed using an etching process. The recess 125 may be formed, for example, by dry etching or a combination of wet etching and dry etching.

When the recess 125 is formed in the fin F1, the projecting isolation film 111 may not be etched or may only be partially etched. Accordingly, the portion of the fin F1 that is disposed between the projecting isolation film portions 111 may not be removed. The height of the isolation film as measured from the upper surface 112 of the substrate 100 to the upper surface of the isolation film 110 is shorter than the height of the fin F1 as measured from the upper surface 112 of the substrate 100 to the upper surface of the fin F1.

In other embodiments, when the recess 125 is formed, a portion of the spacer 151 that is formed on the side surface of the fin F1 may remain. The remaining spacer 151 is a fin spacer 151a which is illustrated in FIGS. 6 to 8, and through a following process in a state where the fin spacer 151a remains, the semiconductor device according to the fourth to sixth embodiments can be formed.

Figure 23:
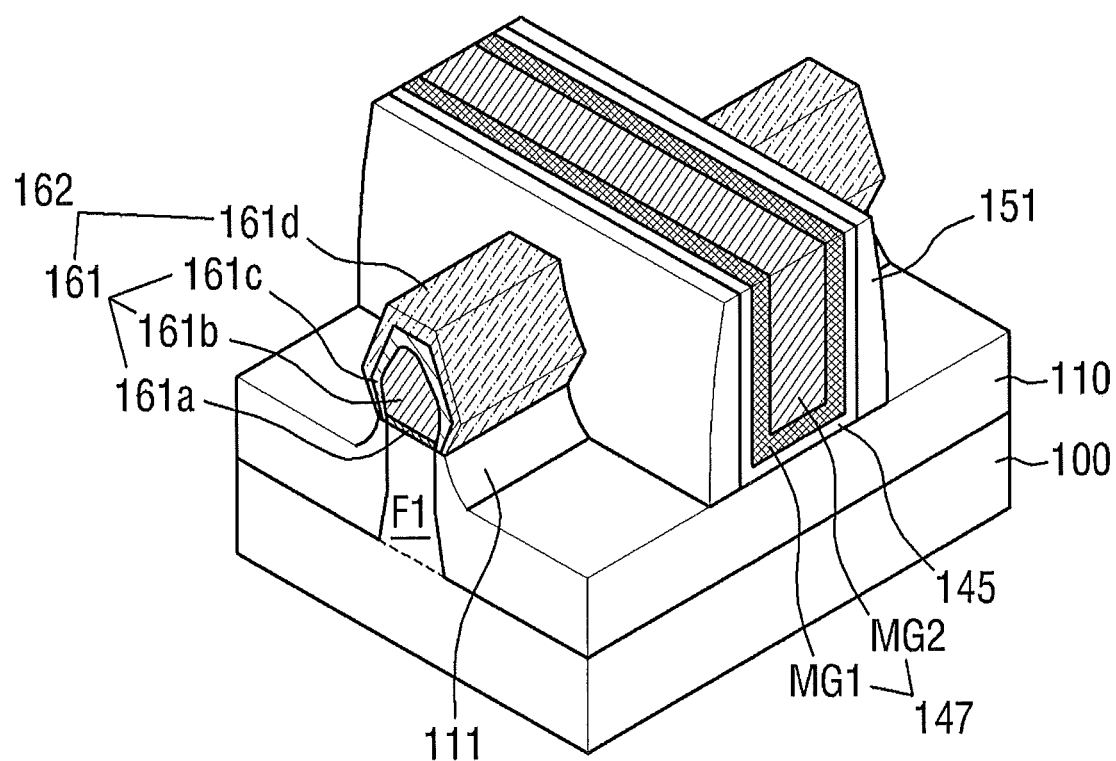

Referring to FIG. 23, a source/drain 162 is formed in the recess 125 on the fin F1. The source/drain 162 may be formed through an epitaxial process. The source/drain 162 may include a first film 161 and a second film 161d. The first film 161 may include a first material that is a compressive stress material, for example, Ge. The first film 161 may include first to third sub-films 161a, 161b, and 161c. The first sub-film 161a may include the first material with a first density, the second sub-film 161b may include the first material with a second density, and the third sub-film 161c may include the first material with a third density. The second density is higher than the first density and the third density. The second density may be in the range of 40% to 65%, and the first and third densities may be in the range of 10% to 30%. The second film 161d may not include the first material or may include a lower density of the first material.

If the size of the source/drain 162 in the first direction X is small, the occurrence of parasitic capacitances and the tendency for bridges to form can be reduced, and thus the source/drain 162 is formed at low pressure. For example, the source/drain 162 may be formed at pressure of 50 torr or less. If the source/drain 162 is formed at low pressure, the size thereof becomes smaller than it would otherwise be if the source/drain 162 was formed at high pressure, and thus the compressive stress that is applied to the channel region may be lowered. However, since the stress film (163 in FIG. 1) is formed later, the mobility of the carriers in the channel region may be improved.

Figure 24:
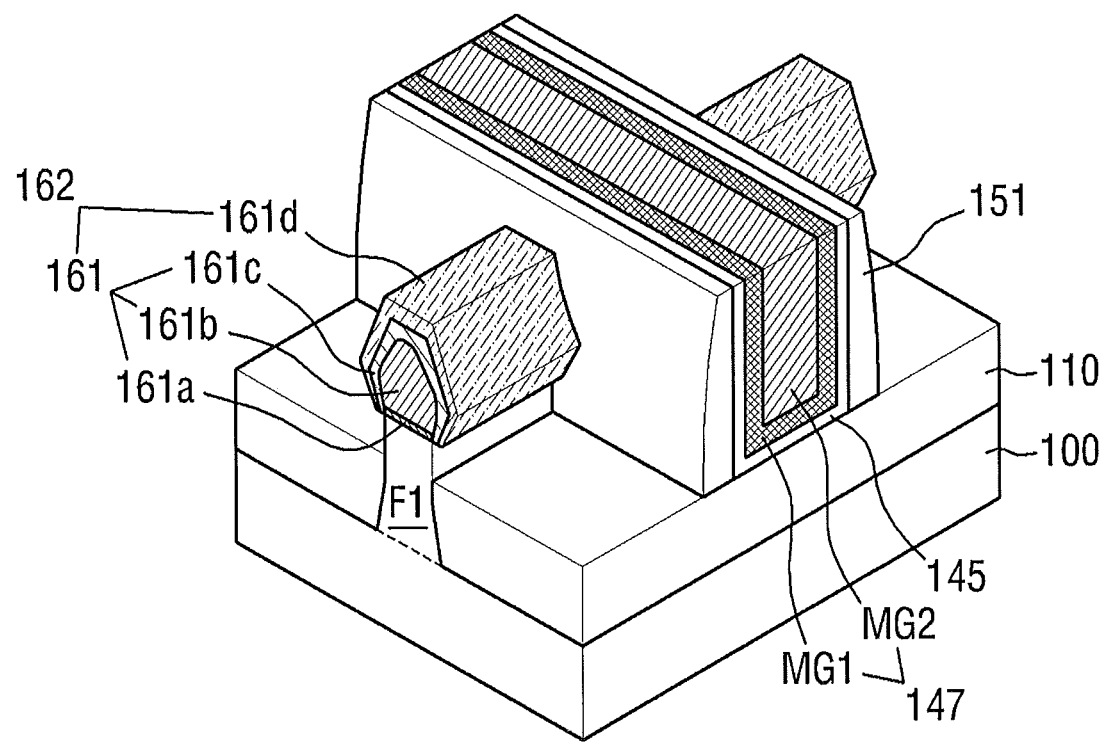

Then, referring to FIGS. 12 and 24, the side surface of the fin F1 is exposed by removing the projecting isolation film 111 that surrounds the fin F1 on the lower portion of the source/drain 162 (S600). In order to expose the side surface of the fin F1, at least one of dry etching and wet etching may be used. The projecting isolation film portion 111 and the isolation film 110 may be made of the same material, and thus a part of the upper surface of the isolation film 110 may be etched when the projecting isolation film portion 111 is etched.

Then, referring to FIGS. 12 and 1, a stress film 163 is formed on the exposed side surface of the fin F1 (S700).

The stress film 163 may be formed between the isolation film 110 and the source/drain 162, and may be formed through an epitaxial process. The stress film 163 may include the first material, like the source/drain 162. However, since the stress film 163 has only the purpose to apply the compressive stress to the channel region, it may not be doped with an impurity, for example, boron (B), unlike the source/drain 162.

Since parasitic capacitances and/or bridging may occur as the size of the stress film 163 becomes larger, the stress film 163 may be formed at low pressure to make the size of the stress film 163 small. For example, the stress film 163 may be formed by performing epitaxial growth at pressure of 50 torr or less.

Figure 25:
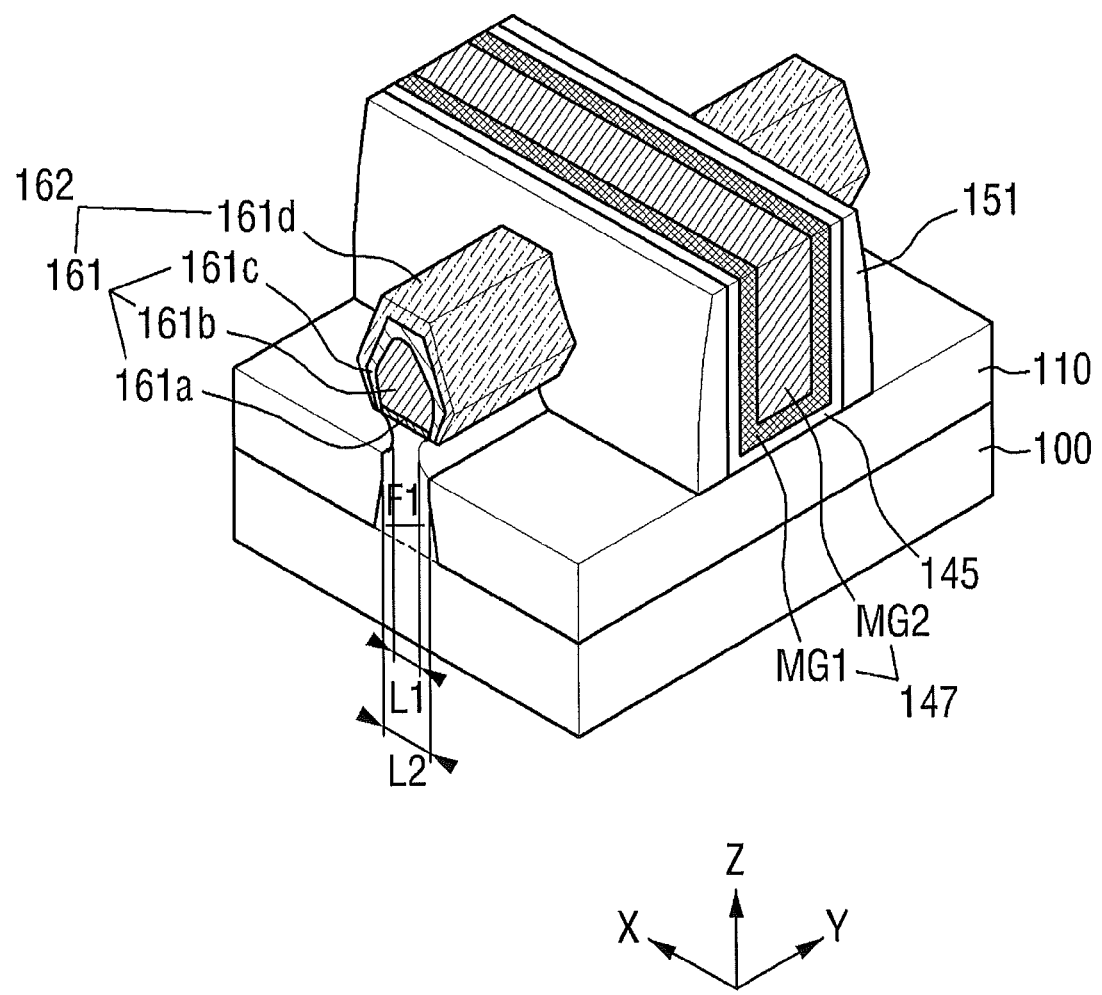
FIG. 25 is a view of a device formed in an intermediate step of a method for fabricating a semiconductor device according to a second embodiment of the present invention.

Referring to FIGS. 4, 21, and 25, a method for fabricating a semiconductor device according to a second embodiment of the present invention will be described. The discussion of the second embodiment below will focus on aspects that differ from the first embodiment, and explanation of aspects that are the same will generally be omitted.

FIG. 25 is a perspective view of a device that if formed at an intermediate step of a method for fabricating a semiconductor device according to a second embodiment of the present invention.

The method for fabricating a semiconductor device according to the second embodiment of the present invention is different from the method for fabricating a semiconductor device according to the first embodiment of the present invention in that the side surface of the fin F1 is exposed by removing the projecting isolation film portion 111 in a different way. In the method for fabricating a semiconductor device according to the second embodiment of the present invention, a wet etching process is used to remove the projecting isolation film portion 111. The wet etching may be performed using SC1 (Standard Cleaning 1) etchant (including $NH_4OH$, $H_2O_2$, $H_2O$, and the like). In this case, as shown in FIG. 25, not only the projecting isolation film 111 but also a part of the side surface of the fin F1 is etched. Since the part of the side surface of the fin F1 is etched, the first width L1 of the fin F1 is smaller than the second width L2 of the first sub-film 161a.

Then, the stress film 163 is formed on the exposed side surface of the fin F1 at low pressure. Then, a semiconductor device 102 having the shape as shown in FIG. 4 may be formed.

Referring to FIGS. 5, 24, 26, and 27, a method for fabricating a semiconductor device according to a third embodiment of the present invention will be described. The discussion of the third embodiment below will focus on aspects that differ from the first and second embodiments, and explanation of aspects that are the same will generally be omitted.

Figure 26:
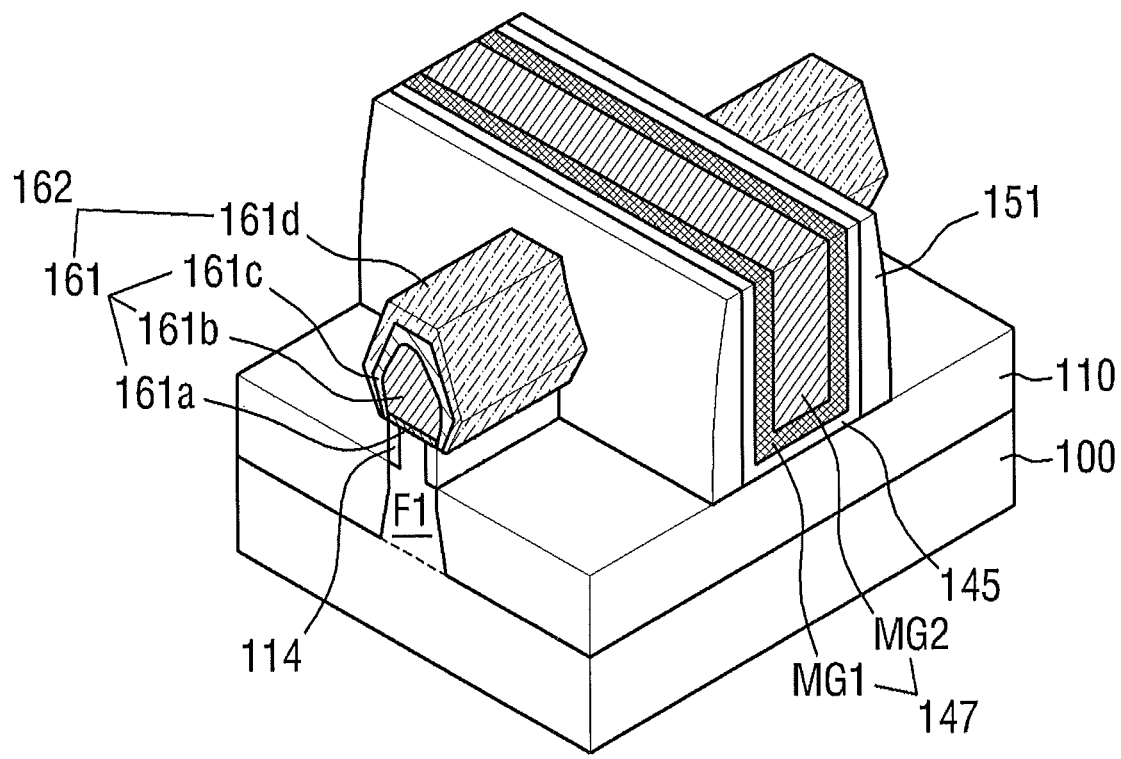
FIGS. 26 and 27 are views of devices formed in intermediate steps of a method for fabricating a semiconductor device according to a third embodiment of the present invention.
Figure 27:
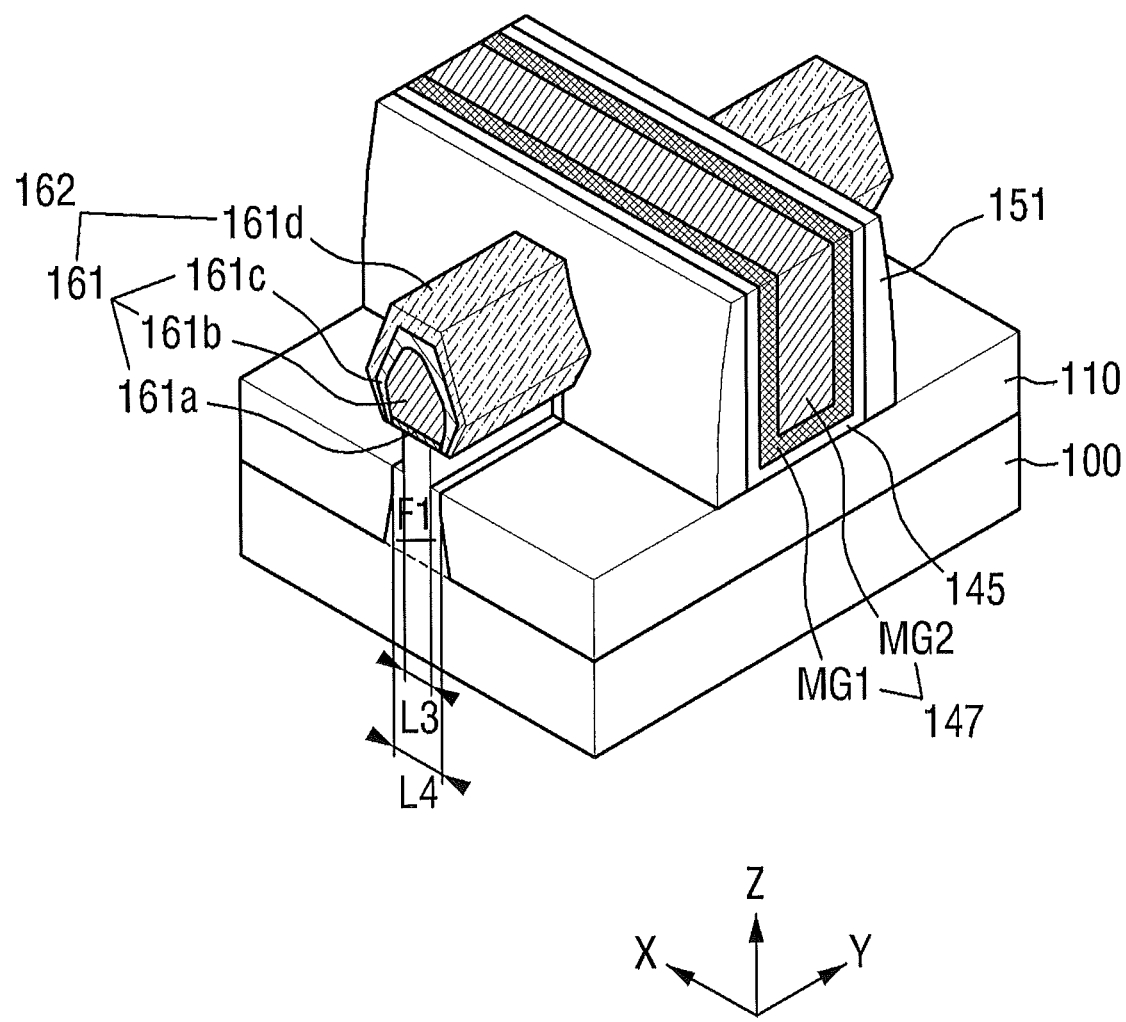

FIGS. 26 and 27 are perspective views of devices that are formed at intermediate steps of a method for fabricating a semiconductor device according to a third embodiment of the present invention.

According to the method for fabricating a semiconductor device according to the third embodiment of the present invention, as shown in FIG. 26, after the side surface of the fin F1 is exposed, the exposed side surface of the fin F1 is oxidized. Accordingly, an oxide film 114 is formed on the exposed side surface of the fin F1. The oxide film 114 is formed on the exposed side surface of the fin F1 to have a predetermined width. Then, the fin F1 is exposed by removing the oxidized side surface of the fin F1. That is, a part of the side surface of the fin F1 can be removed as shown in FIG. 27 by removing the oxide film 114. In order to etch the oxide film 114, at least one of dry etching and wet etching may be used. If the oxide film 114 is removed, the first width L3 of the fin F1 becomes smaller than the second width L4 of the first sub-film 161a. Further, the exposed side surface of the fin F1 may form a straight line in the third direction Z. Accordingly, in the method for fabricating a semiconductor device according to the second embodiment of the present invention, the side surface of the fin F1 on which the stress film 163 is formed as a curved surface, whereas in the method for fabricating a semiconductor device according to the third embodiment of the present invention, the side surface of the fin F1 on which the stress film 163 is formed as a flat surface.

Then, the stress film 163 is formed on the exposed side surface of the fin F1, and thus the semiconductor device 103 having the shape as shown in FIG. 5 may be formed.

Figure 28:
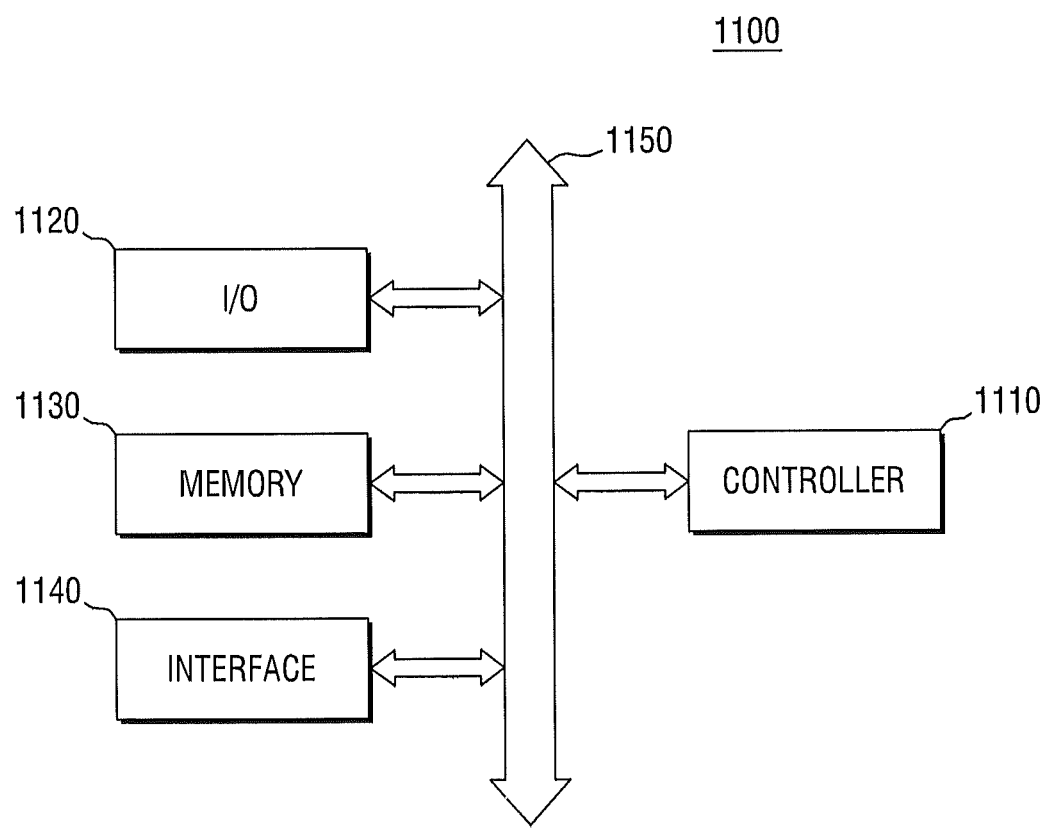
FIG. 28 is a block diagram of an electronic system including a semiconductor device according to some embodiments of the present invention.

FIG. 28 is a block diagram of an electronic system including a semiconductor device according to some embodiments of the present invention.

Referring to FIG. 28, an electronic system 1100 according to an embodiment of the present invention may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include at least one of a microprocessor, a digital signal processor, a microcontroller, and logic elements that can perform similar functions. The I/O device 1120 may include a keypad, a keyboard, and a display device. The memory 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver. Although not illustrated, the electronic system 1100 may further include a high-speed DRAM and/or SRAM as an operating memory for improving the operation of the controller 1110. A fin field-effect transistor according to embodiments of the present invention may be provided inside the memory 1130 or may be provided as a part of the controller 1110 and/or the I/O device 1120.

The electronic system 1100 may be applied to a PDA (Personal Digital Assistant), a portable computer, a web tablet, a wireless phone, a mobile phone, a digital music player, a memory card, or any other electronic device that can transmit and/or receive information in wireless environments.

Figure 29:
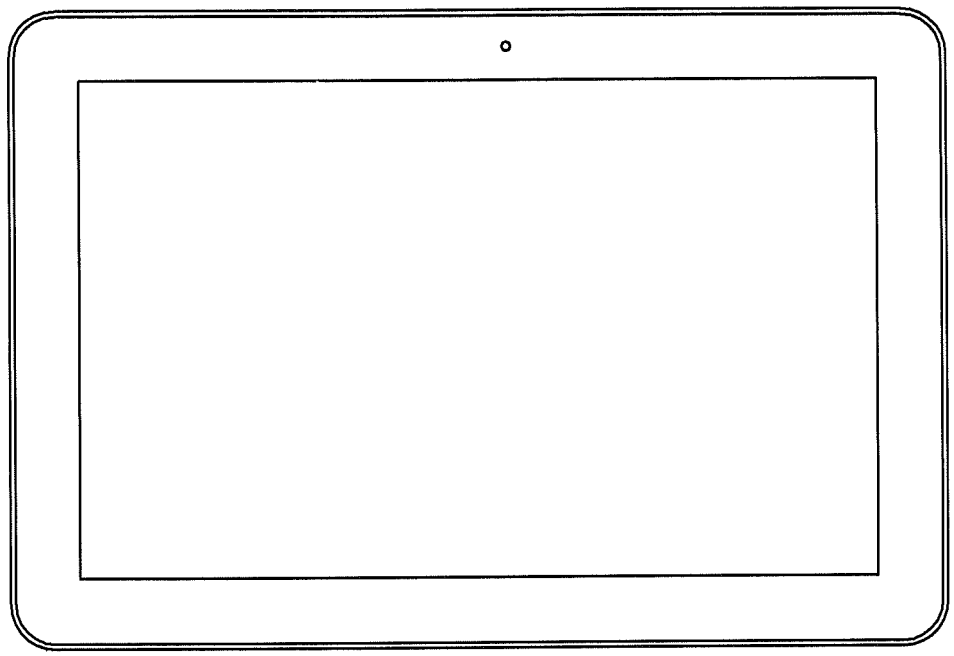
FIGS. 29 and 30 are exemplary views of a semiconductor system to which the semiconductor device according to some embodiments of the present invention can be applied.
Figure 30:
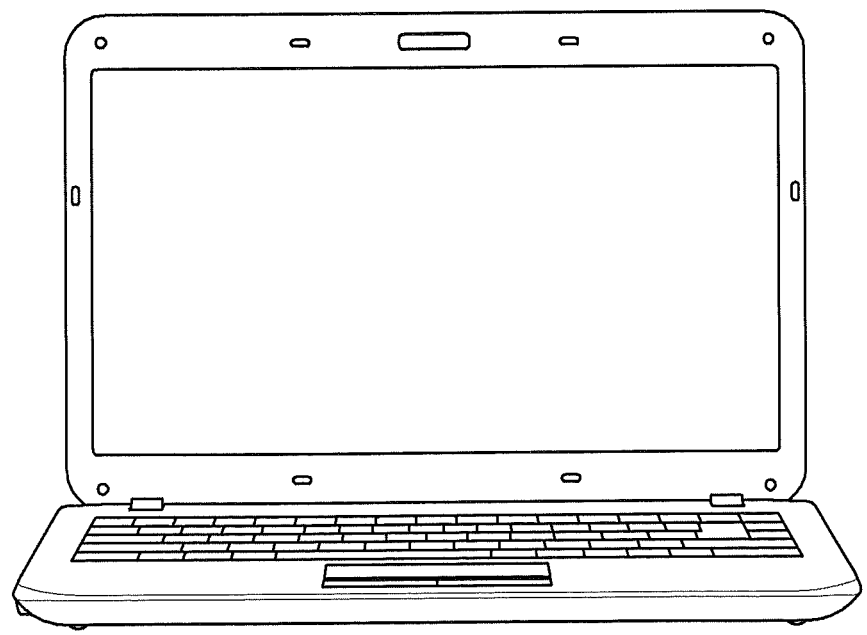

FIGS. 29 and 30 are exemplary views of a semiconductor system to which the semiconductor device according to some embodiments of the present invention can be applied. FIG. 29 illustrates a tablet PC, and FIG. 30 illustrates a notebook PC. At least one of the semiconductor devices 101 to 106 according to the embodiments of the present invention may be used in the tablet PC or the notebook PC. It is apparent to those of skilled in the art that the semiconductor device according to some embodiments of the present invention can be applied to other integrated circuit devices that have not been exemplified.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A semiconductor device comprising:
    a substrate;
    an isolation film on the substrate;
    a fin projecting away from the substrate through a recess in the isolation film;
    a gate electrode that crosses the fin;
    a source/drain formed on a side of the gate electrode, the source/drain including a first film and a second film; and
    a stress film that is on a side surface of the fin, the stress film positioned between the isolation film and the source/drain, wherein:
    the fin includes a first portion having a top surface protruding further in an upward direction than a top surface of the isolation film, and
    a second portion on both sides of the first portion, the second portion having a top surface protruding further in the upward direction than the top surface of the isolation film and protruding in the upward direction less than the top surface of the first portion.

2. The semiconductor device of claim 1, further comprising a spacer on a sidewall of the fin between a bottom surface of the source/drain and a top surface of the stress film 3. The semiconductor device of claim 1, wherein the first film includes a first material.

4. The semiconductor device of claim 3, wherein the first material includes Ge.

5. The semiconductor device of claim 3, wherein the first film includes first to third sub-films,
    the first to third sub-films include the first material with first to third densities, respectively, and
    the first sub film is on an outer surface of the fin, the second sub-film is on the first sub-film opposite the fin, and the third sub-film is on the second sub-film opposite the first sub-film.

6. The semiconductor device of claim 5, wherein a width of an outer surface of the fin is smaller than a width of a bottom surface of the first sub-film 7. The semiconductor device of claim 5, wherein the second density is higher than the first and third densities.

8. A fin transistor, comprising:
    a fin that projects away from a substrate through a recess in an isolation layer that is on the substrate, the fin extending on the substrate along a first direction;
    a source/drain on an outer surface of the fin, the source/drain including a first film that is on the fin and that includes a first stress material that applies a stress to the fin and a second film on the first film opposite the fin, the second film having a different composition than the first film;
    a gate electrode on the fin and adjacent to the source/drain; and
    a stress film that is between the isolation layer and the source/drain on a side surface of the fin, wherein:
    the fin includes a first portion having a top surface protruding further in an upward direction than a top surface of the isolation layer, and
    a second portion on both sides of the first portion, the second portion having a top surface protruding further in the upward direction than the top surface of the isolation layer and protruding in the upward direction less than the top surface of the first portion.

9. The fin transistor of claim 8, wherein the first film includes a first sub film that is on the top surface of the fin, a second sub-film that is on the first sub-film opposite the fin, and a third sub-film that is on the second sub-film opposite the first sub-film, wherein the second film is on the third sub-film opposite the second sub-film.

10. The fin transistor of claim 9, wherein the second sub-film includes the first material, and wherein a density of the first stress material in the second sub-film exceeds a density of the first stress material in the first sub-film and a density of the first stress material in the third sub-film.

11. The fin transistor of claim 8, wherein the fin is formed of a second material and the first stress material comprises a compressive stress material that has a larger lattice constant than the second material.

12. The fin transistor of claim 11, wherein the second material comprises silicon, and the first stress material comprises germanium, and wherein the first film comprises a silicon-germanium film.

13. The fin transistor of claim 8, wherein the stress film includes the first stress material and wherein the fin does not include the first stress material.

14. The fin transistor of claim 8, further comprising a spacer on a sidewall of the fin between a top surface of the stress film and a bottom surface of the source/drain.

15. The fin transistor of claim 8, wherein the second film does not include the first stress material.

16. The fin transistor of claim 8, wherein a base of the fin that is on the substrate has a width along a second direction that is perpendicular to the first direction that is greater than a width along the second direction of the outer surface of the fin.

17. A fin transistor, comprising:
- a fin that projects away from a substrate through a recess in an isolation layer that is on the substrate, the fin extending on the substrate along a first direction;
- a source/drain on an outer surface of the fin, the source/drain including a first film that is on the fin and that includes a first stress material that applies a stress to the fin and a second film on the first film opposite the fin, the second film having a different composition than the first film;
- a gate electrode on the fin and adjacent to the source/drain; and
- a stress film that is between the isolation layer and the source/drain on a side surface of the fin,
- wherein the first film includes a first sub film that is on a top surface of the fin, a second sub-film that is on the first sub-film opposite the fin, and a third sub-film that is on the second sub-film opposite the first sub-film, wherein the second film is on the third sub-film opposite the second sub-film, and wherein the fin transistor further comprises a spacer between the gate electrode and the source/drain,
- wherein the first sub-film is directly on the outer surface of the fin, and
- wherein a width of the first sub-film along a second direction that is perpendicular to the first direction is greater than a width of the outer surface of the fin along the second direction.

* * * * *